(12) United States Patent
Lee et al.

(10) Patent No.: US 11,348,989 B2
(45) Date of Patent: May 31, 2022

(54) ELECTRONIC PANEL AND ELECTRONIC APPARATUS INCLUDING THE SAME

(71) Applicant: Samsung Display Co., Ltd., Yongin-Si (KR)

(72) Inventors: Kwangsae Lee, Asan-si (KR); Ji-Hyun Ka, Seongnam-si (KR); Kimyeong Eom, Suwon-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 163 days.

(21) Appl. No.: 16/909,032

(22) Filed: Jun. 23, 2020

(65) Prior Publication Data

US 2021/0057505 A1    Feb. 25, 2021

(30) Foreign Application Priority Data

Aug. 19, 2019    (KR) .................. 10-2019-0101298

(51) Int. Cl.
*H01L 27/32* (2006.01)
*H01L 51/00* (2006.01)

(52) U.S. Cl.
CPC ...... *H01L 27/3276* (2013.01); *H01L 51/0096* (2013.01); *H01L 27/323* (2013.01)

(58) Field of Classification Search
CPC ............. H01L 27/3276; H01L 51/0096; H01L 27/323; H01L 27/3225; H01L 27/3246; H01L 27/3248; H01L 51/0031; H01L 51/52; Y02E 10/549; G06F 3/041
See application file for complete search history.

(56) References Cited

U.S. PATENT DOCUMENTS

| | | | |
|---|---|---|---|
| 2018/0204901 A1 | 7/2018 | Hwang et al. | |
| 2019/0019441 A1 | 1/2019 | Shin et al. | |
| 2019/0057632 A1* | 2/2019 | Kim | G09G 3/3225 |
| 2020/0161406 A1 | 5/2020 | Lee et al. | |
| 2020/0265783 A1 | 8/2020 | Lee et al. | |

FOREIGN PATENT DOCUMENTS

| | | |
|---|---|---|
| KR | 10-2018-0085398 | 7/2018 |
| KR | 10-2019-007570 | 1/2019 |
| KR | 10-2020-0057139 | 5/2020 |
| KR | 10-2020-0101555 | 8/2020 |

* cited by examiner

*Primary Examiner* — Kyoung Lee
(74) *Attorney, Agent, or Firm* — F. Chau & Associates, LLC

(57) ABSTRACT

An electronic panel including: a base substrate including a first area and a second area, wherein the first area includes a module area and a display area adjacent to the module area; a display element layer including a plurality of display elements, wherein the plurality of display elements overlaps the first area; an encapsulation layer configured to cover the display elements; sensing patterns overlapping the first area and disposed on the encapsulation layer; a crack sensing pattern overlapping the module area and disposed on the encapsulation layer; an auxiliary pattern overlapping the module area and disposed on the encapsulation layer, wherein the auxiliary pattern has a shape that extends along an edge of the crack sensing pattern and extends between the sensing patterns and the crack sensing pattern; and a signal line disposed on the encapsulation layer to electrically connect the crack sensing pattern to the auxiliary pattern.

20 Claims, 15 Drawing Sheets

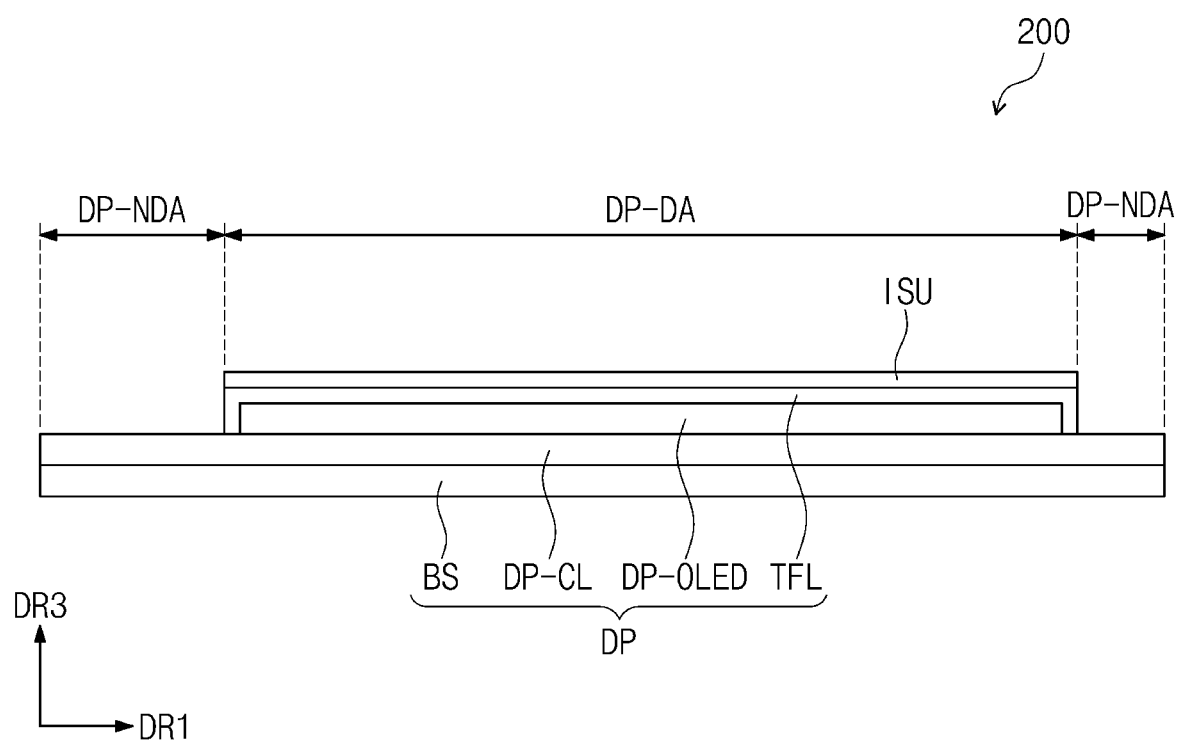

ELECTRONIC PANEL AND ELECTRONIC APPARATUS INCLUDING THE SAME

CROSS-REFERENCE TO RELATED APPLICATION

This U.S. non-provisional patent application claims priority under 35 U.S.C. § 119 to Korean Patent Application No. 10-2019-0101298, filed on Aug. 19, 2019, the disclosure of which is incorporated by reference herein in its entirety.

TECHNICAL FIELD

The present inventive concept relates to an electronic apparatus, and more particularly, to an electronic panel, in which a through-hole is provided and which is configured to sense an external input, and an electronic apparatus including the electronic panel.

DISCUSSION OF THE RELATED ART

Generally, electronic apparatuses are activated according to an electrical signal. Such an electronic apparatus includes various electronic components such as an electronic panel and an electronic module. For example, the electronic panel may include a display unit and a sensing unit that senses an external input (e.g., a touch input by a user). Further, the display unit may display an image. The electronic components may be electrically connected to each other by signal lines, which are variously arranged.

For example, the display unit includes a light emitting element that generates an image. The sensing unit may include sensing electrodes for sensing an external input. The sensing electrodes are disposed on an active area. The sensing unit is designed to provide substantially uniform sensitivity on an entire surface of the active area.

SUMMARY

According to an exemplary embodiment of the present inventive concept, an electronic panel including: a base substrate including a first area and a second area adjacent to the first area, wherein the first area includes a module area and a display area adjacent to the module area; a display element layer including a plurality of display elements, wherein the plurality of display elements overlaps the first area and are disposed on the base substrate; an encapsulation layer configured to cover the display elements and disposed on the base substrate; sensing patterns overlapping the first area and disposed on the encapsulation layer; a crack sensing pattern overlapping the module area and disposed on the encapsulation layer; an auxiliary pattern overlapping the module area and disposed on the encapsulation layer, wherein the auxiliary pattern has a shape that extends along an edge of the crack sensing pattern and extends between the sensing patterns and the crack sensing pattern; and a signal line disposed on the encapsulation layer to electrically connect the crack sensing pattern to the auxiliary pattern.

In an exemplary embodiment of the present inventive concept, the signal line includes: a first detection line part including a first main line and a first connection line configured to connect the first main line to a first end of the crack sensing pattern, wherein the first main line overlaps the second area; a second detection line part including a second main line and a second connection line configured to connect the second main line to a first end of the auxiliary pattern, wherein the second main line is connected to a second end of the crack sensing pattern; and a third direction line part including a third main line connected to a second end of the auxiliary pattern.

In an exemplary embodiment of the present inventive concept, the first main line, the second main line, and the third main line are spaced apart from each other in a plan view.

In an exemplary embodiment of the present inventive concept, the crack sensing pattern has a curved shape.

In an exemplary embodiment of the present inventive concept, the electronic panel further includes: a first pad part including a first output pad and a first input pad connected to a first end of the second main line, wherein the first output pad is connected to a first end of the first main line; and a second pad part including a second output pad and a second input pad connected to one end of the third main line, wherein the second output pad is connected to a second end of the first main line.

In an exemplary embodiment of the present inventive concept, a first detection signal inputted to the first input pad is transmitted to the second end of the crack sensing pattern through the second main line, and the first detection signal is transmitted from the second end of the crack sensing pattern to the first end of the crack sensing pattern, and wherein the first detection signal is transmitted from the first end of the crack sensing pattern to the first output pad and the second output pad through the first connection line and the first main line.

In an exemplary embodiment of the present inventive concept, a second detection signal inputted to the second input pad is transmitted to the second end of the auxiliary pattern through the third main line, and the second detection signal is transmitted from the second end of the auxiliary pattern to the first end of the auxiliary pattern, wherein the second detection signal is transmitted from the first end of the auxiliary pattern to the second end of the crack sensing pattern through the second connection line and the second main line, and wherein the second detection signal is transmitted from the second end of the crack sensing pattern to the first output pad and the second output pad through the first connection line and the first main line.

In an exemplary embodiment of the present inventive concept, the second end of the second main line is connected to the second end of the crack sensing pattern, and the second end of the third main line is connected to the second end of the auxiliary pattern.

In an exemplary embodiment of the present inventive concept, the first area surrounds the module area, and each of the sensing patterns and the auxiliary pattern is provided as a mesh pattern.

In an exemplary embodiment of the present inventive concept, each of the second main line and the third main line includes a first portion overlapping the second area and a second portion overlapping the first area.

In an exemplary embodiment of the present inventive concept, the signal line further includes a plurality of sensing signal lines spaced apart from the first to third detection line parts and respectively connected to the sensing patterns.

In an exemplary embodiment of the present inventive concept, each of the sensing patterns, the crack sensing pattern, the auxiliary pattern, and the signal line is directly disposed on the encapsulation layer.

In an exemplary embodiment of the present inventive concept, the electronic panel further includes a hole provided in the module area to pass through the electronic panel, wherein the crack sensing pattern extends along an edge of the hole.

In an exemplary embodiment of the present inventive concept, a first distance between the crack sensing pattern and a center of the hole is less than a second distance between the auxiliary pattern and the center of the hole.

In an exemplary embodiment of the present inventive concept, the crack sensing pattern includes: a first extension part extending along an edge of the hole; a second extension part disposed farther from a center of the hole when compared to the first extension part and is spaced apart from the first extension part to extend along an edge of the first extension part; and a connection part configured to connect the first extension part to the second extension part.

In an exemplary embodiment of the present inventive concept, the first area is an area on which an image is displayed, and the module area and the second area are a non-display area on which the image is not displayed.

According to an exemplary embodiment of the present invention, an electronic apparatus includes: an electronic panel configured to display an image and sense an external input; and an electronic module disposed to overlap the electronic panel, wherein the electronic panel includes: a base substrate including a module area, an active area, and a peripheral area that is adjacent to the active area, wherein the module area includes a through-hole, and wherein the active area surrounds the module area; sensing patterns overlapping the active area and disposed on the base substrate; a crack sensing pattern overlapping the module area and disposed on the base substrate, wherein the crack sensing patterning has a curved shape extending along an edge of the through-hole; an auxiliary pattern overlapping the module area and disposed on the base substrate, wherein the auxiliary pattern extends along an edge of the crack sensing pattern and extends between the sensing patterns and the crack sensing pattern; and a signal line configured to electrically connect the crack sensing pattern to the auxiliary pattern.

In an exemplary embodiment of the present inventive concept, the sensing patterns, the crack sensing pattern, the auxiliary pattern, and the signal line are disposed on a same layer as each other.

In an exemplary embodiment of the present inventive concept, the sensing patterns, the crack sensing pattern, the auxiliary pattern, and the signal line are disposed on the base substrate through a one-time process using a same material.

In an exemplary embodiment of the present inventive concept, the electronic apparatus further includes: a first detection line part including a first main line and a first connection line configured to connect the first main line to a first end of the crack sensing pattern, wherein the first main line overlaps the peripheral area; a second detection line part including a second main line and a second connection line configured to connect the second main line to a first end of the auxiliary pattern, wherein the second main line is connected to a second end of the crack sensing pattern; and a third detection line part including a third main line connected to a second end of the auxiliary pattern.

BRIEF DESCRIPTION OF THE DRAWINGS

The above and other features of the present inventive concept will become more apparent by describing in detail exemplary embodiments thereof, with reference to the accompanying drawings, in which:

FIG. 3 is a cross-sectional view of an electronic panel according to an exemplary embodiment of the present inventive concept;

DETAILED DESCRIPTION OF THE EMBODIMENTS

Figure 1A:
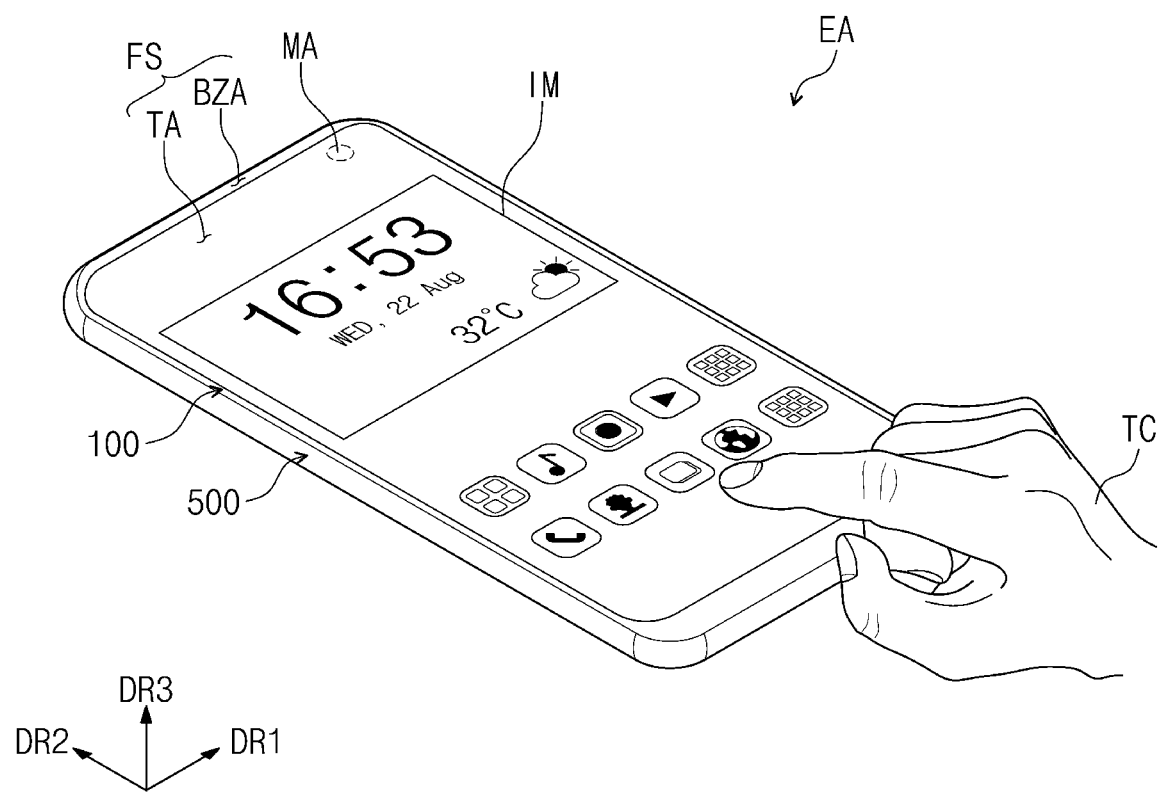
FIG. 1A is a perspective view of an electronic apparatus according to an exemplary embodiment of the present inventive concept.

In this specification, it will be understood that when one component (or region, layer, portion) is referred to as being "on", "connected to", or "coupled to" another component, the component (or region, layer, portion) can be directly disposed/connected/coupled on/to the other component, or an intervening third component may also be present.

It is to be understood that like reference numerals refer to like elements throughout the specification. In addition, in the figures, the thicknesses, ratios, and dimensions of layers, regions, and components may be exaggerated for clarity of illustration.

The term "and/or" includes any and all combinations of one or more of the associated listed items.

It will be understood that although the terms such as 'first' and 'second' may be used herein to describe various elements, these elements should not be limited by these terms. The terms are only used to distinguish one component from other components. For example, an element referred to as a first element in one embodiment can be referred to as a second element in another embodiment without departing from the spirit and scope of the present inventive concept. The terms of a singular form may include plural forms unless referred to the contrary.

In addition, spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, in the example, terms "below" and "beneath" may encompass both an orientation of above, below and beneath. The device may be otherwise oriented (e.g., rotated 90 degrees or at other orientations) and the spatially relative descriptors used herein may be interpreted accordingly.

Hereinafter, exemplary embodiments of the present inventive concept will be described with reference to the accompanying drawings.

Figure 1B:
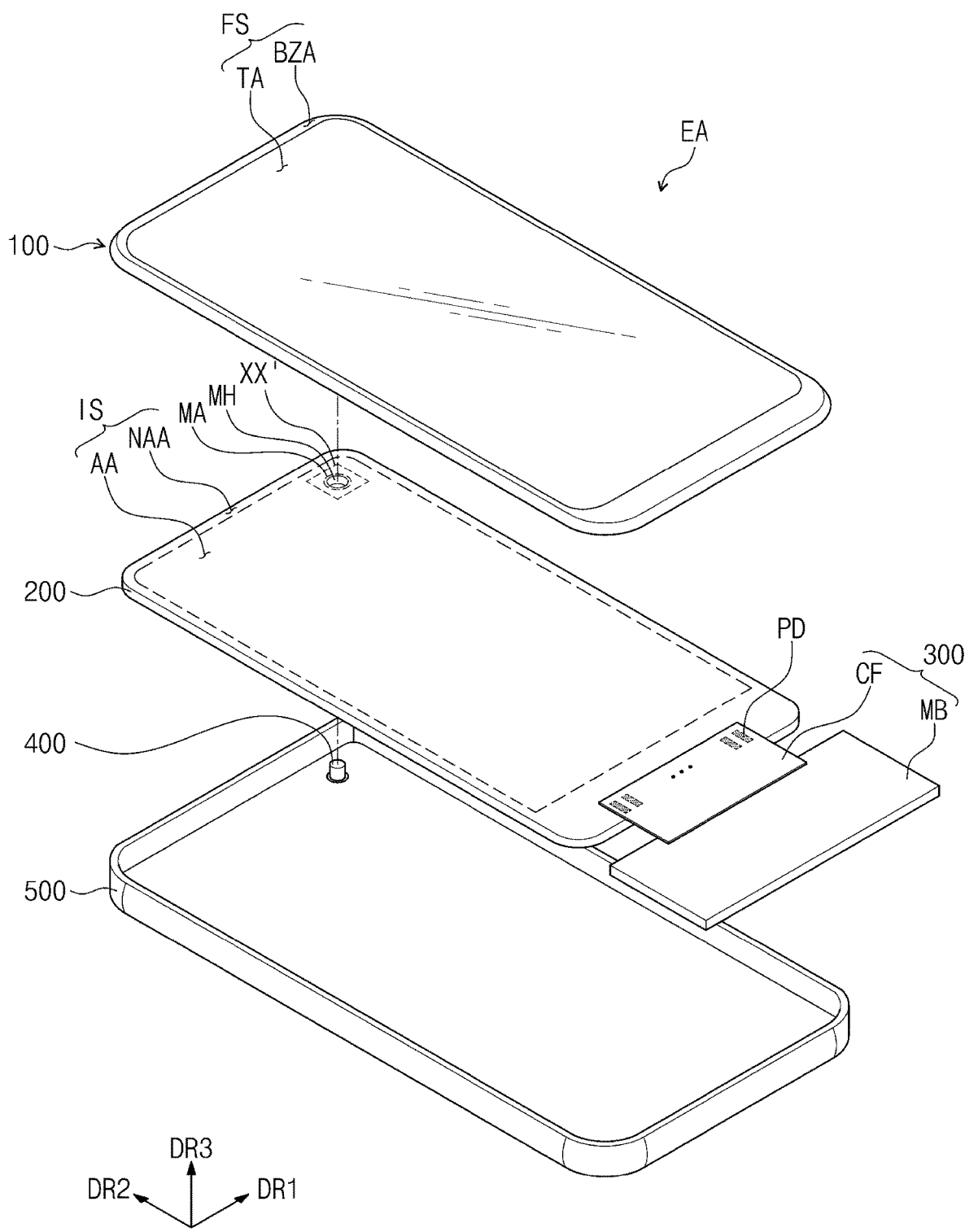
FIG. 1B is an exploded perspective view of the electronic apparatus according to an exemplary embodiment of the present inventive concept.
Figure 2:
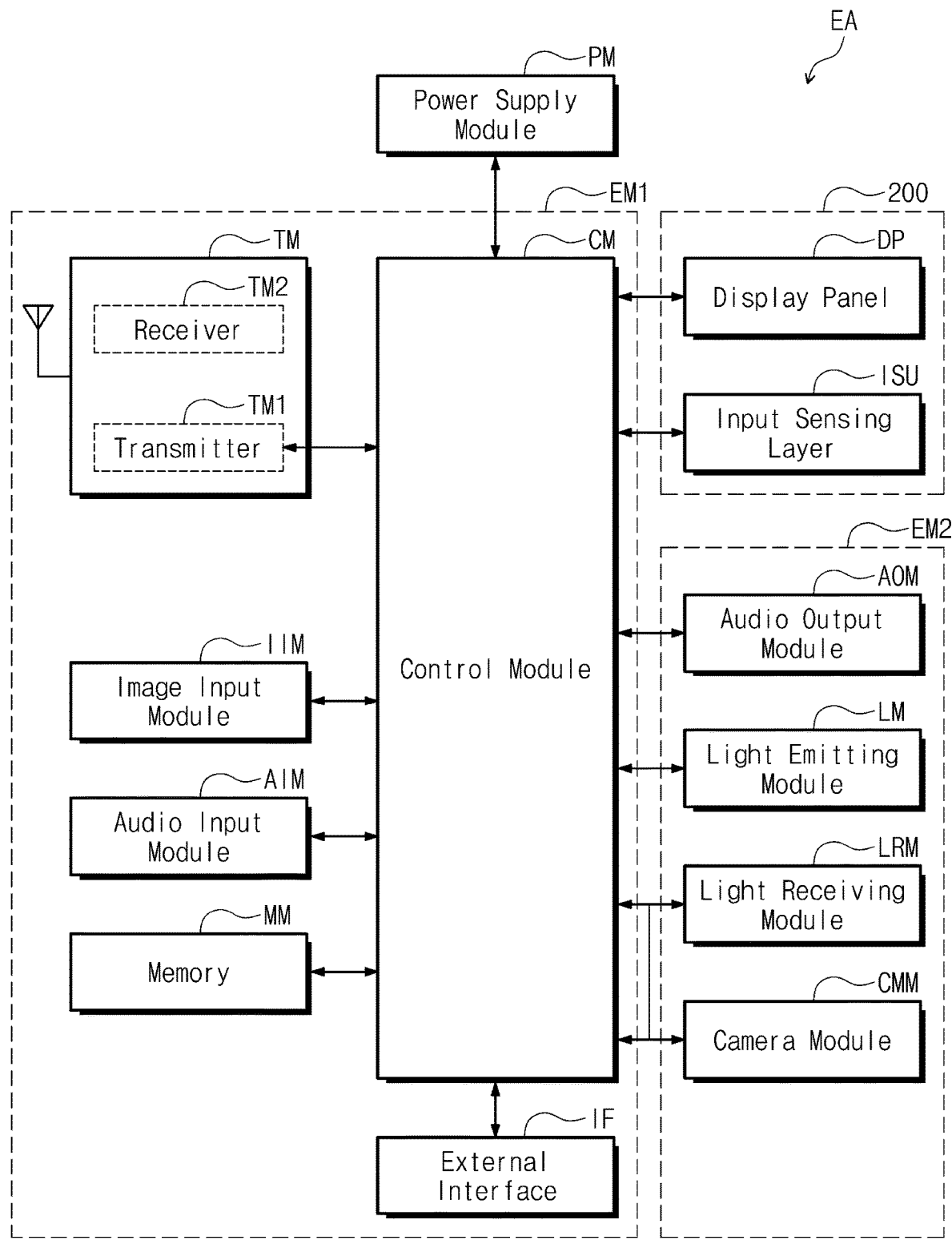
FIG. 2 is a block diagram of the electronic apparatus of FIG. 1A.

FIG. 1A is a perspective view of an electronic apparatus according to an exemplary embodiment of the present inventive concept. FIG. 1B is an exploded perspective view of the electronic apparatus according to an exemplary embodiment of the present inventive concept. FIG. 2 is a block diagram of the electronic apparatus of FIG. 1A.

An electronic apparatus EA may be an apparatus that is activated and/or operated according to an electrical signal. The electronic apparatus EA may include various devices. For example, the electronic apparatus EA may include a tablet, a notebook, a computer, a smart television, and the like. In this embodiment, the electronic apparatus EA will be described as a smart phone; however, the present inventive concept is not limited thereto.

Referring to FIG. 1A, the electronic apparatus EA may display an image IM on a front surface FS. The front surface FS may include a transmission area TA and a bezel area BZA adjacent to the transmission area TA.

The front surface FS may be parallel to a plane formed by a first direction DR1 and a second direction DR2 crossing the first direction DR1. A normal direction of the front surface FS, e.g., a thickness direction of the electronic apparatus EA, is indicated as a third direction DR3. In this specification, "when viewed in a plan view or in the plan view" may mean a case when viewed in the third direction DR3. A front surface (or, e.g., a top surface) and a rear surface (or, e.g., a bottom surface) of each of layers or units, which will be described below, are distinguished by the third direction DR3. However, directions indicated as the first to third directions DR1, DR2, and DR3 may be changed into different directions, for example, opposite directions.

The electronic apparatus EA displays the image IM through the transmission area TA. The image IM may include at least one of a static image or a moving image. In FIG. 1A, the image IM includes the time and a plurality of icons as an example.

The transmission area TA may have a rectangular shape that is parallel to the first direction DR1 and the second direction DR2. However, this is merely an example. For example, the transmission area TA may have various shapes and is not limited to a specific shape.

The bezel area BZA may surround the transmission area TA. However, this is merely an example. For example, the bezel area BZA may be disposed adjacent to only one side of the transmission area TA or may be omitted. However, the present inventive concept is not limited thereto.

The electronic apparatus EA according to an exemplary embodiment of the present inventive concept may sense a user's input TC applied from outside of the electronic apparatus EA. The user's input TC includes various types of external inputs such as a portion of a user's body, light, heat, a pressure, or the like. In addition, the electronic apparatus EA may sense not only an input contacting the electronic apparatus EA but may also sense an approaching or adjacent input that is not contacting the electronic apparatus EA. Further, the electronic apparatus EA may sense an input that is moving.

In this embodiment, the user's input TC is illustrated as a user's hand applied to the front surface FS. However, this is merely an example. For example, as described above, the user's input TC may be provided in various shapes. The electronic apparatus EA may sense the user's input TC applied to a side surface or the rear surface of the electronic apparatus EA according to a structure of the electronic apparatus EA, but the present inventive concept is not limited thereto.

Referring to FIG. 1B, the electronic apparatus EA may include a window 100, an electronic panel 200, a circuit board 300, an electronic module 400, and an external case 500. The window 100 and the external case 500 may be coupled to each other to provide an outer appearance of the electronic apparatus EA. For example, when the window 100 and external case 500 are coupled to each other, they may house the electronic panel 200, the circuit board 300, and the electronic module 400.

The window 100 may be disposed on the electronic panel 200 to cover a front surface IS of the electronic panel 200. The window 100 may include, for example, an optically transparent insulation material. For example, the window 100 may include glass or plastic. The window 100 may have a single layer or multilayered structure. For example, the window 100 may have a laminated structure of a plurality of plastic films bonded to each other by using an adhesive or a laminated structure of a glass substrate and a plastic film, which are bonded to each other by using an adhesive.

The window 100 includes a front surface FS that is exposed to the outside. The front surface FS of the electronic apparatus EA may correspond to the front surface FS of the window 100.

For example, the transmission area TA may be an optically transparent area. The transmission area TA may have a shape corresponding to that of the active area AA. For example, the transmission area TA overlaps at least a portion of the active area AA. The image IM displayed on the active area AA of the electronic panel 200 may be visible through the transmission area TA from the outside.

The bezel area BZA may be an area having light transmittance that is less than that of the transmission area TA. The bezel area BZA forms a shape of the transmission area TA. The bezel area BZA may be disposed adjacent to the transmission area TA to at least partially surround the transmission area TA.

The bezel area BZA may have a predetermined color. When the window 100 includes a glass or plastic substrate, the bezel area BZA may be a color layer that is printed or deposited on at least one surface of the glass or plastic substrate. In addition, the bezel area BZA may be formed by coloring a corresponding area of the glass or plastic substrate.

The bezel area BZA may cover the peripheral area NAA of the electronic panel 200 to prevent the peripheral area NAA from being visible from the outside. However, this is merely an example. For example, in the window 100 according to an exemplary embodiment of the present inventive concept, the bezel area BZA may be omitted.

The electronic panel 200 may include a display panel DP and an input sensing layer ISU, which will be described later with reference to FIG. 2. The display panel DP may generate the image IM. The image IM generated by the display panel DP may be visible from the outside by the user through the transmission area TA. The input sensing layer ISU senses the external input TC applied from the outside. As described above, the input sensing layer ISU may sense the external input TC provided to the window 100.

According to an exemplary embodiment of the present inventive concept, the front surface IS of the electronic panel 200 includes a first area and a second area adjacent to the first area. The first area may correspond to an active area AA at least partially surrounding the module area MA, and the second area may correspond to a peripheral area NAA. The active area AA may be an area that is activated according to an electrical signal. The module area MA and the second area may be a non-display areas on which an image is not displayed.

The active area AA may be an area on which the image IM is displayed, and also, the external input TC is sensed. The transmission area TA overlaps at least active area AA. For example, the transmission area TA overlaps an entire surface of at least a portion of the active area AA. Thus, the user may see the image IM through the transmission area TA or provide the external input TC. However, this is merely an example. For example, an area of the active area AA, on which the image IM is displayed, and an area of the active area AA, on which the external input TC is sensed, may be separated from each other, but the present inventive concept is not limited thereto.

The peripheral area NAA may be an area covered by the bezel area BZA. The peripheral area NAA is adjacent to the active area AA. The peripheral area NAA may at least partially surround the active area AA. A driving circuit or a driving line for driving the active area AA may be disposed on the peripheral area NAA.

Various signal lines providing an electrical signal to the active area AA, pads PD, or electronic elements may be disposed on the peripheral area NAA. The peripheral area NAA may be covered by the bezel area BZA and thus may not be visible from the outside.

In this embodiment, the electronic panel 200 may be assembled in a state in which the active area AA and the peripheral area NAA are substantially flat to face the window 100. However, this is merely an example. For example, a portion of the peripheral area NAA of the electronic panel 200 may be bent. Here, a portion of the peripheral area NAA may be disposed to face a rear surface of the electronic apparatus EA to reduce an area of the bezel BZA on the front surface FS of the electronic apparatus EA. For example, the bent peripheral area NAA may face the external case 500. In addition, the electronic panel 200 may be assembled in a state in which a portion of the active area AA is bent. As an additional example, in the electronic panel 200 according to an exemplary embodiment of the present inventive concept, the peripheral area NAA may be omitted.

The module area MA may have relatively high transmittance when compared to a portion of the active area AA with the same surface area as the module area MA. The module area MA is at a position overlapping the electronic module 400 described later in the plan view.

At least a portion of the module area MA may be surrounded by the active area AA. In this embodiment, the module area MA is spaced apart from the peripheral area NAA. For example, the module area MA is shown as being inside the active area AA so that all edges are surrounded by the active area AA.

The electronic panel 200 may include a panel hole MH in the module area MA and passing through the electronic panel 200. The panel hole MH may pass through at least one of the display panel DP or the input sensing layer ISU. An edge of the module area MA may be substantially spaced a predetermined distance from an edge of the panel hole MH to extend along the edge of the panel hole MH. The edge of the module area MA may have a shape corresponding to the panel hole MH.

The circuit board 300 may be connected to the electronic panel 200. The circuit board 300 may include a flexible board CF and a main board MB. The flexible board CF may include an insulation film and conductive lines mounted on the insulation film. The conductive lines are connected to the pads PD to electrically connect the circuit board 300 to the electronic panel 200.

In this embodiment, the flexible board CF may be assembled in a bent state such that the main board MB may be disposed on the rear surface of the electronic panel 200. Thus, the main board MB may be disposed on a rear surface of the electronic panel 200 to be accommodated in a space provided by the external case 500. In this embodiment, the flexible board CF may be omitted. For example, the main board MB may be directly connected to the electronic panel 200.

The main board MB may include signal lines and electronic elements. The electronic elements may be connected to the signal lines so as to be electrically connected to the electronic panel 200. The electronic elements may generate various electrical signals, for example, a signal for generating the image IM or a signal for sensing the external input TC. In addition, the electronic elements may include, for example, a processor that processes the sensed signal. For example, there may be a plurality of main boards MB for electronic elements that generate the electrical signals, but the present inventive concept is not limited thereto.

In the electronic apparatus EA according to an exemplary embodiment of the present inventive concept, the driving circuit that provides an electrical signal to the active area AA may be mounted on the electronic panel 200. For example, the driving circuit may directly mounted on the electronic panel 200. Here, the driving circuit may be mounted in the form of a chip or may be formed together with pixels PX, which are to be described. Here, a surface area of the circuit board 300 may be reduced or omitted. The electronic apparatus EA according to an exemplary embodiment of the present inventive concept may be implemented according to various embodiments, and is not limited to a specific embodiment.

The electronic module 400 is disposed below the window 100. The electronic module 400 may overlap the panel hole MH provided in the module area MA. The electronic module 400 may receive an external input transmitted through the module area MA or may provide an output through the module area MA.

In the electronic module 400, a receiver, which receives the external input, and an output circuit, which provides an output (e.g., a signal), may overlap the module area MA in the plan view. A portion or the whole of the electronic module 400 may be accommodated in the module area MA or the panel hole MH. According to an exemplary embodiment of the present inventive concept, the electronic module 400 may be disposed to overlap the active area AA, thereby reducing a surface area of the bezel area BZA.

Referring to FIG. 2, the electronic apparatus EA may include an electronic panel 200, a power supply module PM, a first electronic module EM1, and a second electronic module EM2. The electronic panel 200, the power supply module PM, the first electronic module EM1, and the second electronic module EM2 may be electrically connected to each other. FIG. 2 illustrates an example of the display panel DP and the input sensing layer ISU as components of the electronic panel 200.

The first electronic module EM1 and the second electronic module EM2 may include various functional modules for driving the electronic apparatus EA. For example, the first electronic module EM1 may be directly mounted on a mother board electrically connected to the electronic panel 200, or the first electronic module EM1 may be mounted on a separate board and electrically connected to the mother board through a connector. For example, the first electronic module EM1 may be mounted on the main board MB; however, the present inventive concept is not limited thereto.

The first electronic module EM1 may include a control module CM, a wireless communication module TM, an image input module IIM, an audio input module AIM, a memory MM, and an external interface IF. A portion of the modules may not be mounted on the mother board but may be electrically connected to the mother board through a flexible circuit board.

The control module CM controls the overall operation of the electronic apparatus EA. For example, the control module CM may be a microprocessor. For example, the control module CM may activate or inactivate the electronic panel 200. The control module CM may control other modules such as the image input module IIM and/or the audio input module AIM on the basis of a touch signal received from the electronic panel 200.

The wireless communication module TM may transmit/receive a wireless signal to/from the other terminal by using Bluetooth or Wi-Fi connections. The wireless communication module TM may transmit/receive an audio signal by using a general communication line. The wireless communication module TM includes a transmitter TM1 modulating and transmitting a signal to be transmitted and a receiver TM2 demodulating the received signal.

The image input module IIM processes the image signal to convert the processed image signal into image data that may be displayed on the electronic panel 200. The audio input module AIM receives external audio signals by using a microphone during recording mode or a voice recognition mode to convert the received audio signal into electrical sound data.

The external interface IF serves as an interface connected to an external charger, a wired/wireless data port, and a card socket (for example, a memory card and a SIM/UIM card).

The second electronic module EM2 may include an audio output module AOM, a light emitting module LM, a light receiving module LRM, and a camera module CMM. For example, the above-described components may be directly mounted on the mother board. As an additional example, the components may be mounted on a separate board and may be electrically connected to the electronic panel 200 through a connector. As another example, the components may be electrically connected to the first electronic module EM1.

The audio output module AOM converts audio data received from the wireless communication module TM or audio data stored in the memory MM to output the converted audio data to the outside.

The light emitting module LM generates and outputs light. The light emitting module LM may output infrared rays. For example, the light emitting module LM may include an LED element. For example, the light receiving module LRM may sense infrared rays. The light receiving module LRM may be activated when infrared rays having a predetermined level or more is sensed. The light receiving module LRM may include a CMOS sensor. The infrared rays generated in the light emitting module LM may be outputted and then be reflected by an external object (for example, a user's finger or face), and the reflected infrared rays may be incident into the light receiving module LRM. The camera module CMM photographs an external image.

The electronic module 400 according to an exemplary embodiment of the present inventive concept may include at least one of the constituents of the first electronic module EM1 or of the second electronic module EM2. For example, the electronic module 400 may include at least one of a camera, a speaker, an optical detection sensor, or a thermal detection sensor. The electronic module 400 may sense an external object received through the module area MA or provide a sound signal such as a voice to the outside through the module area MA. In addition, the electronic module 400 may include a plurality of components, but the present inventive concept is not limited thereto.

In the electronic module 400 disposed to overlap the module area MA, the external object may be visible through the module area MA, or an output signal generated by the electronic module 400 may be transmitted to the outside. The electronic apparatus EA according to an exemplary embodiment of the present inventive concept may further include a transparent member disposed between the electronic module 400 and the electronic panel 200. The transparent member may be an optically transparent film so that the external input transmitted through the panel hole MH passes through the transparent member and is transmitted to the electronic module 400. The transparent member may be attached to the rear surface of the electronic panel 200 or may be disposed between the electronic panel 200 and the electronic module 400 without an adhesion layer. The electronic apparatus EA according to an exemplary embodiment of the present inventive concept may have various shapes, but the present inventive concept is not limited thereto.

According to the present inventive concept, the electronic module 400 may be assembled to overlap the transmission area TA in the plan view. Thus, the increase in area of the bezel area BZA due to the accommodation of the electronic module 400 may be prevented.

FIG. 3 is a cross-sectional view of the electronic panel according to an exemplary embodiment of the present inventive concept.

Referring to FIG. 3, the display panel DP includes a base substrate BS, a circuit element layer DP-CL, a display element layer DP-OLED, and an encapsulation layer TFL. The circuit element layer DP-CL is disposed on the base substrate BS.

According to an exemplary embodiment of the present inventive concept, the display panel DP may be an emission type display panel, but present inventive concept is not limited thereto. For example, the display panel DP may be an organic light emitting display panel or a quantum-dot light emitting display panel. A light emitting layer of the organic light emitting display panel may include an organic light emitting material. A light emitting layer of the quantum dot light emitting display panel may include a quantum dot, a quantum rod, and the like. Hereinafter, the organic light emitting display panel will be described as an example of the display panel DP.

The display panel DP includes a display area DP-DA and a non-display area DP-NDA. The display area DP-DA of the display panel DP may correspond to the active area AA of FIG. 1B, and the non-display area DP-NDA may correspond to the peripheral area NAA of FIG. 1B.

The base substrate BS may include at least one plastic film. The base substrate BS may include a plastic substrate, a glass substrate, a metal substrate, or an organic/inorganic composite substrate as a flexible board.

The circuit element layer DP-CL includes at least one intermediate insulation layer and a circuit element. For example, the intermediate insulation layer includes at least one intermediate inorganic film and at least one intermediate organic film. The circuit element includes signal lines, a driving circuit of a pixel, and the like.

The display element layer DP-OLED may include a plurality of display elements. For example, the display elements may be provided as organic light emitting elements. The display element layer DP-OLED may further include an organic layer such as a pixel defining layer.

The encapsulation layer TFL seals the display element layer DP-OLED. For example, the encapsulation layer TFL may be a thin film encapsulation layer. The encapsulation layer TFL may protect the display element layer DP-OLED against foreign substances such as moisture, oxygen, and dust particles.

The input sensing layer ISU may be disposed between the window 100 and the display panel DP. The input sensing layer ISU senses an input applied from the outside. The input applied from the outside may be provided in various manners. For example, the external input may include various types of external inputs such as a portion of user's body, a stylus pen, light, heat, a pressure, or the like. In addition, an input may be a physical touch (e.g., making contact) by a portion of the human body, such as a user's hands, or may be adjacent or neighboring space touches (for example, hovering).

The input sensing layer ISU may be disposed on the display panel DP. For example, the input sensing layer ISU may be directly disposed on the display panel DP. In this specification, that "a constituent A is directly disposed on a constituent B" may mean that an adhesive member is not disposed between the constituents A and B. In the present embodiment, the input sensing layer ISU may be manufactured together with the display panel DP through a continuous process.

Figure 4A:
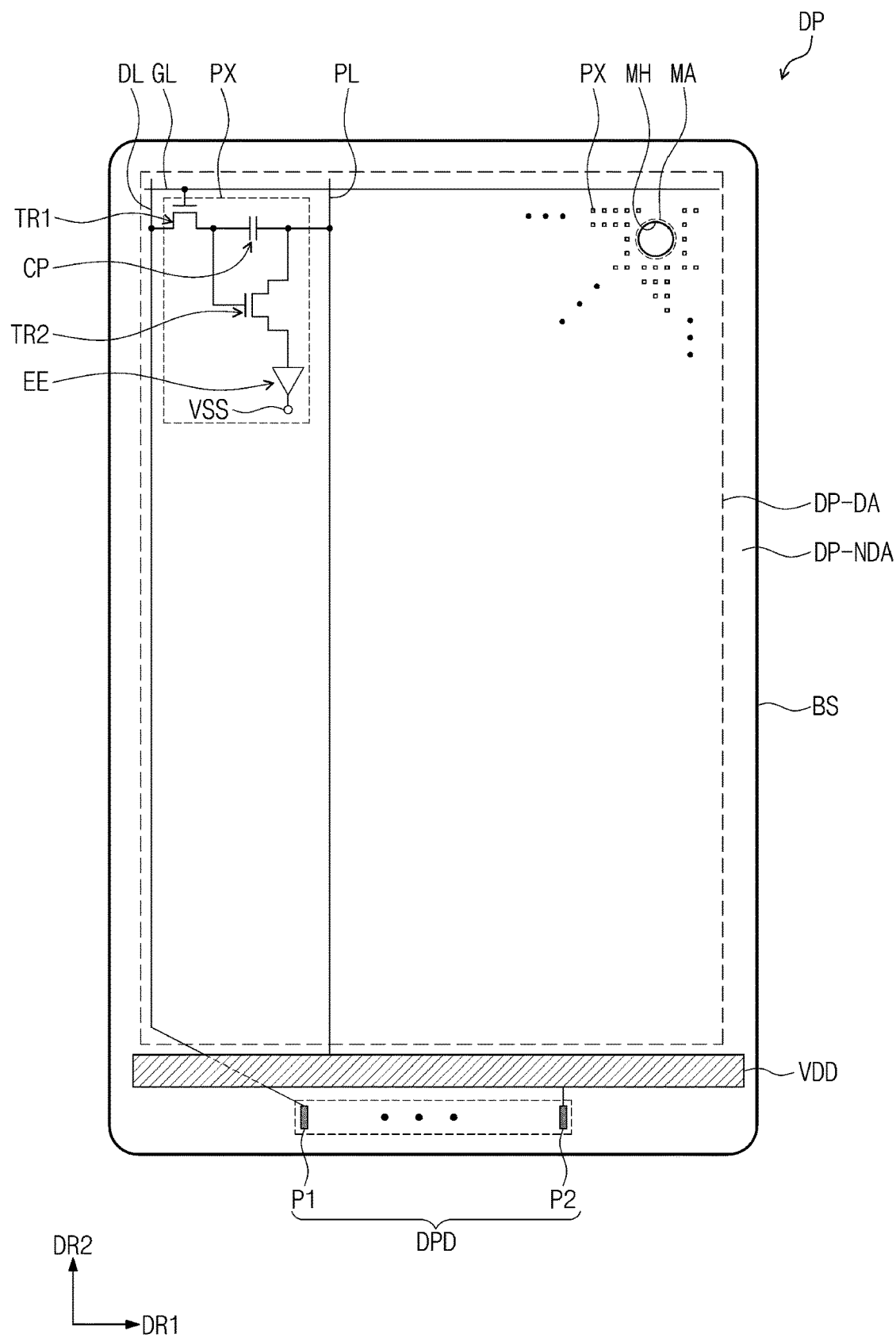
FIG. 4A is a plan view illustrating a display panel according to an exemplary embodiment of the present inventive concept.
Figure 4B:
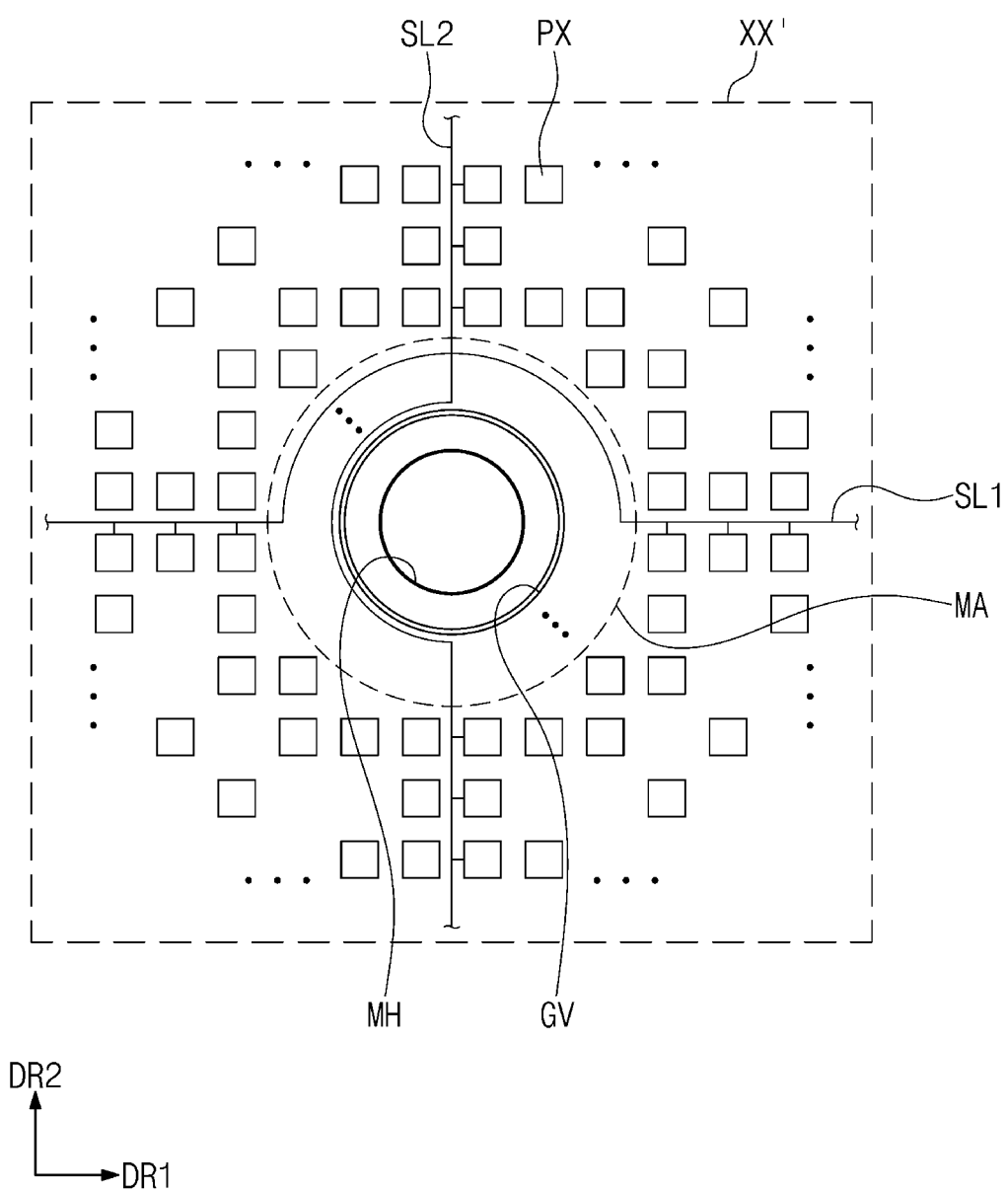
FIG. 4B is an enlarged view of an area XX' of FIG. 1B.

FIG. 4A is a plan view illustrating the display panel according to an exemplary embodiment of the present inventive concept. FIG. 4B is an enlarged view of an area XX' of FIG. 1B.

The display panel DP includes a base substrate BS, a plurality of pixels PX, a plurality of signal lines GL, DL, and PL, and a plurality of display pads DPD.

Referring to FIG. 4A, the display panel DP includes a base substrate BS, a plurality of pixels PX, a plurality of signal lines GL, DL, and PL, and a plurality of display pads DPD. The active area AA and the peripheral area NAA may be areas provided by the base substrate BS. The base substrate BS may include an insulation substrate. For example, the base substrate BS may be made of glass, plastic, or a combination thereof.

The signal lines GL, DL, and PL are connected to the pixels PX to transmit electrical signals to the pixels PX. A scan line GL, a data line DL, and a power line PL of the signal lines provided in the display panel DP are illustrated as an example. However, the signal lines GL, DL, and PL may further include at least one of a power line, an initialization voltage line, or an emission control line, but the present inventive concept is not limited thereto.

The pixels PX may be disposed on the display area DP-DA. In this embodiment, an enlarged signal circuit diagram of one pixel PX of the plurality of pixels is illustrated as an example. The pixel PX may include a first thin film transistor TR1, a capacitor CP, a second thin film transistor TR2, and a light emitting element EE. The first thin film transistor TR1 may be a switching element that turns the pixel PX on and off. The first thin film transistor TR1 may transmit or block the data signal transmitted through the data line DL in response to the scan signal transmitted through the scan line GL to a gate terminal of the first thin film transistor TR1.

The capacitor CP is connected to the first thin film transistor TR1 and the power line PL. The capacitor CP charges electrical charges by an amount corresponding to a difference between the data signal received from the first thin film transistor TR1 and a first power signal applied to the first power line PL.

The second thin film transistor TR2 is connected to the first thin film transistor TR1, the capacitor CP, and the light emitting element EE. The second thin film transistor TR2 controls driving current flowing to the light emitting element EE based on an amount of charges stored in the capacitor CP. A turn-on time of the second thin film transistor TFT2 may be determined according to the amount of charges charged in the capacitor CP. The second thin film transistor TR2 provides the first power signal transmitted through the power line PL during the turn-on time to the light emitting element EE.

The light emitting element EE may generate light or control an amount of light according to the electrical signal. For example, the light emitting element EE may include an organic light emitting element, a quantum dot light emitting element, an electrophoretic element, or an electrowetting element.

The light emitting element EE may be connected to a power source terminal VSS to receive a power signal (hereinafter, referred to as a second power signal) different from the first power signal provided by the power line PL. Driving current corresponding to a difference between the electrical signal provided from the second thin film transistor TR2 and the second power signal may flow through the light emitting element EE, and the light emitting element EE may generate light corresponding to the driving current. However, this is merely an example, and the present inventive concept is not limited thereto. For example, the pixel PX may include electronic elements having various configurations and arrangements.

The pixels PX may be disposed around the panel hole MH to at least partially surround the panel hole MH in the plan view. In FIG. 4B, for convenience of description, the module area MA is illustrated by a dotted line. The area XX' includes an area in which the panel hole MH is provided. Hereinafter, the panel hole MH provided in the display panel DP will be described with reference to FIG. 4B.

As described above, the panel hole MH may be formed in the display area DP-DA. Thus, at least a portion of the pixels PX may be disposed adjacent to the panel hole MH. A portion of the pixels PX may at least partially surround the panel hole MH.

A predetermined recessed pattern GV may be formed in the module area MA. The recessed pattern GV is disposed along an edge of the panel hole MH in the plan view, and in this embodiment, the recessed pattern GV has an annular shape surrounding the panel hole MH. However, this is merely an example. For example, the recessed pattern GV may have a shape different from that of the panel hole MH. For example, the recessed pattern GV may have a polygonal shape, an oval shape, an at least partially circular shape, or a shape including a plurality of partially cut patterns. However, the present inventive concept is not limited thereto.

The recessed pattern GV corresponds to a portion that is recessed from the front surface of the display panel DP and blocks a path in which moisture or oxygen is introduced into the pixel PX through the panel hole MH. This will be described later in detail.

A plurality of signal lines SL1 and SL2 connected to the pixels PX may be disposed on the module area MA. The signal lines SL1 and SL2 may be connected to the pixels PX via the module area MA. In FIG. 4B, for convenience of description, an example in which a first signal line SL1 and a second signal line SL2 of the plurality of signal lines connected to the pixels PX is illustrated.

The first signal line SL1 extends in the first direction DR1. The first signal line SL1 is connected to the pixels within the same row arranged in the first direction DR1 of the pixels PX. The structure in which the first signal line SL1 corresponds to the scan line GL will be described as an example.

A portion of the pixels PX connected to the first signal line SL1 may be disposed at the left side of the panel hole MH, and other portion of the pixels PX may be disposed at the right side of the panel hole MH. Thus, the pixels in the same row connected to the first signal line SL1 may be turned on/off by substantially the same gate signal even though a portion of the pixels with respect to the panel hole MH is omitted.

The second signal line SL2 extends in the second direction DR2. The second signal line SL2 is connected to a column of pixels, of the pixels PX of the display panel DP, arranged in the second direction DR2. The structure in which the second signal line SL2 corresponds to the data line DL will be described as an example.

A portion of the pixels PX connected to the second signal line SL2 may be disposed above the panel hole MH from a plan view, and the other portion of the pixels PX may be disposed below the panel hole MH from a plan view. Thus, the pixels in the same row connected to the second signal line SL2 may receive a data signal through the same line even though a portion of the pixels with respect to the panel hole MH is omitted.

Referring again to FIG. 4A, a power source pattern VDD is disposed on the non-display area DP-NDA. For example, the non-display area DP-NDA may correspond to the peripheral area NAA (see, e.g., FIG. 1B). In this embodiment, the power source pattern VDD is connected to the plurality of power lines PL. Thus, since the display panel DP includes the power source pattern VDD, the same first power signal may be provided to the plurality of pixels.

The display pads DPD may include a first pad P1 and a second pad P2. The first pad P1 may be provided in plurality, and the plurality of first pads P1 may be connected to the data lines DL, respectively. The second pad P2 may be connected to the power source pattern VDD and electrically connected to the power line PL. The display panel DP may provide electrical signals provided from the outside (e.g., a controller) to the pixels PX through the display pads DPD. The display pads DPD may further include pads for receiving other electrical signals in addition to the first pad P1 and the second pad P2, but the present inventive concept is not limited thereto.

Figure 5:
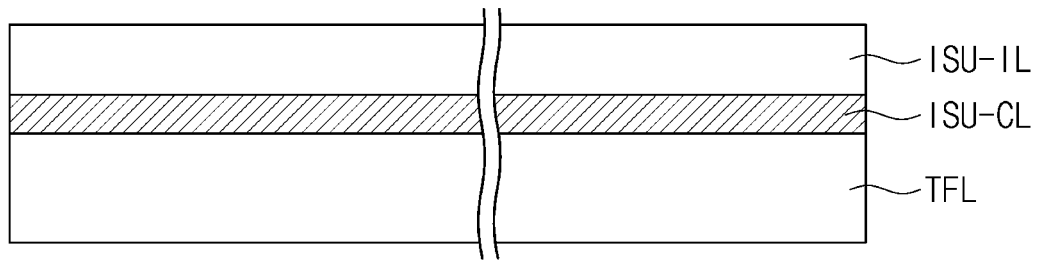
FIG. 5 is a cross-sectional view of an input sensing layer according to an exemplary embodiment of the present inventive concept.
Figure 6:
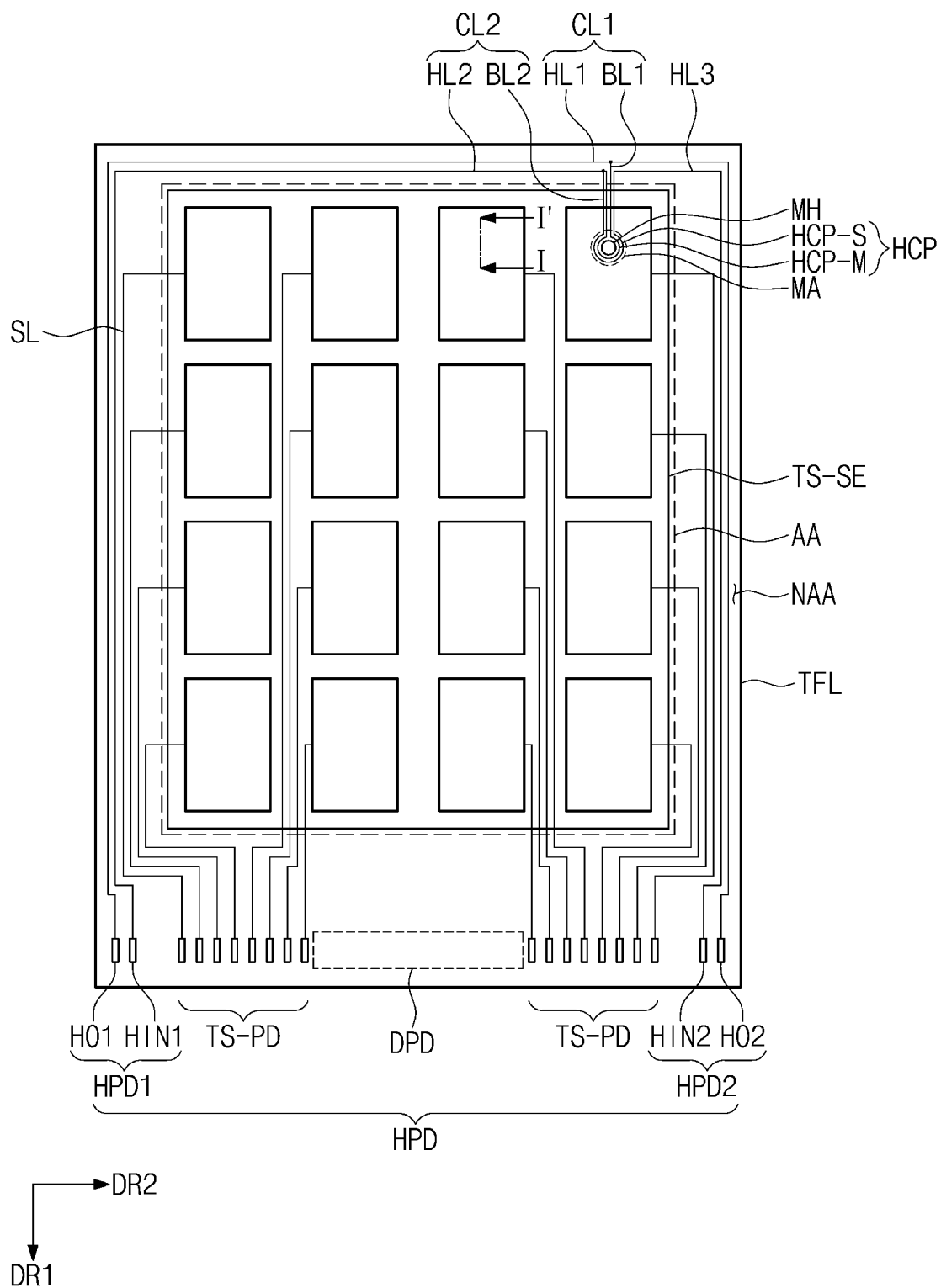
FIG. 6 is a plan view of the input sensing layer according to an exemplary embodiment of the present inventive concept.
Figure 7B:
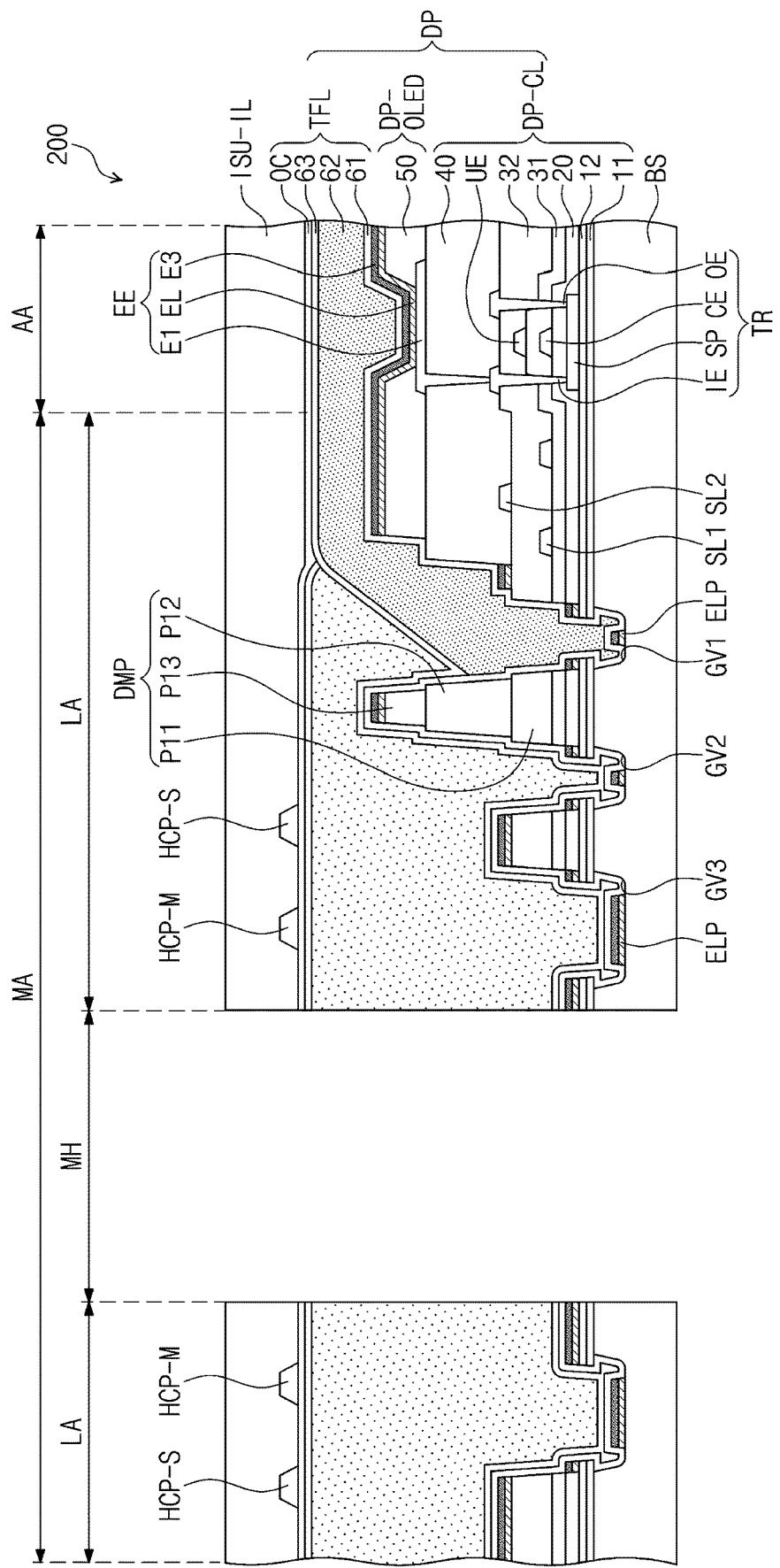
FIG. 7B is a cross-sectional view illustrating a portion of an area of the electronic panel according to an exemplary embodiment of the present inventive concept.
Figure 8:
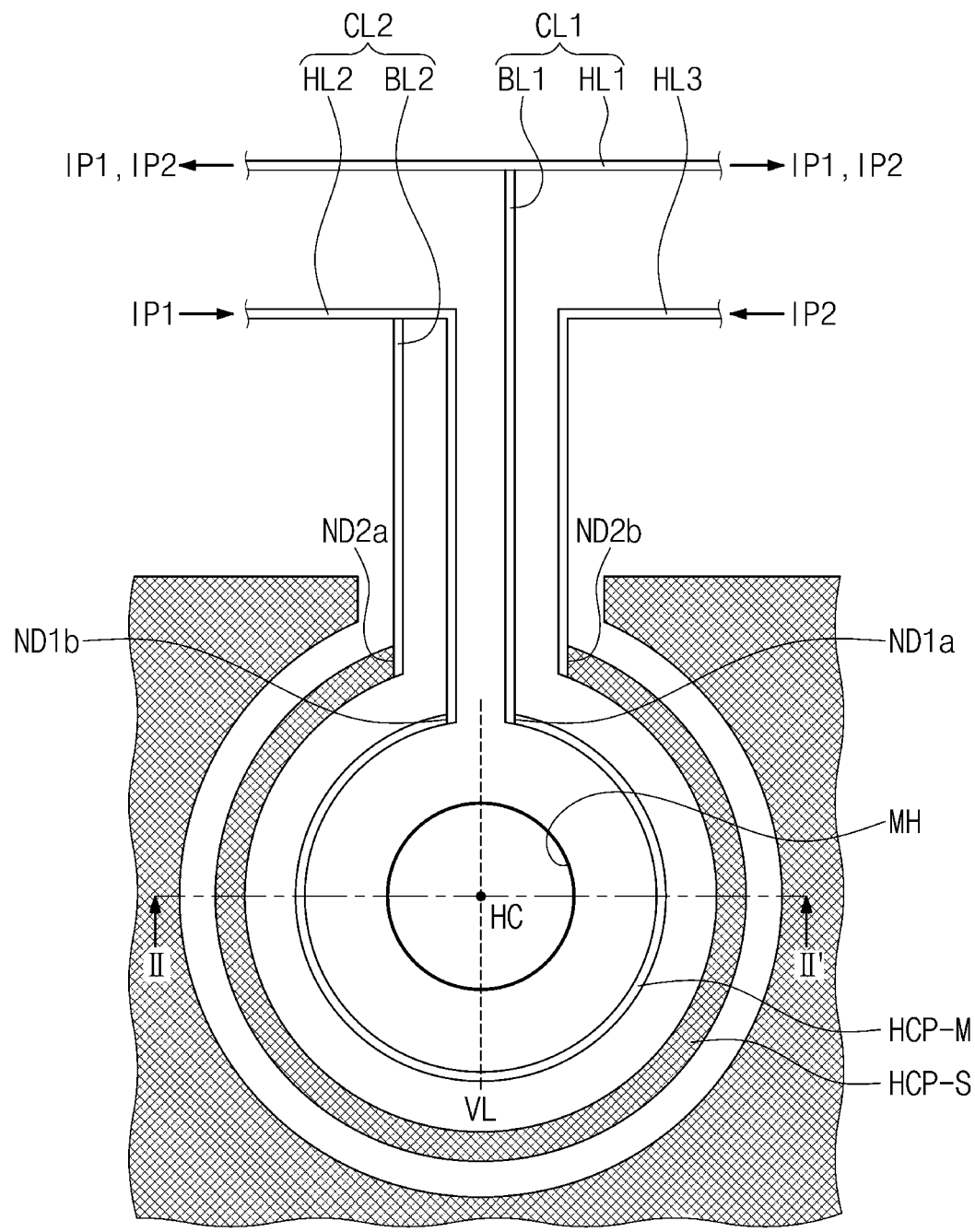
FIG. 8 is a plan view of a crack sensing circuit according to an exemplary embodiment of the present inventive concept.

FIG. 5 is a cross-sectional view of the input sensing layer according to an exemplary embodiment of the present inventive concept. FIG. 6 is a plan view of the input sensing layer according to an exemplary embodiment of the present inventive concept. FIG. 8 is a cross-sectional view taken along line I-I' of FIG. 6 according to an exemplary embodiment of the present inventive concept. FIG. 7B is a cross-sectional view illustrating a portion of an area of the electronic panel according to an exemplary embodiment of the present inventive concept.

Referring to FIG. 5, the input sensing layer ISU includes a conductive layer ISU-CL and a sensing insulation layer ISU-IL.

According to an exemplary embodiment of the present inventive concept, the conductive layer ISU-CL may be formed on the encapsulation layer TFL by a continuous process. For example, the conductive layer ISU-CL of the input sensing layer ISU disposed on the encapsulation layer TFL may be provided as a single layer. The inputted user's input TC described in FIG. 1A may be sensed through the conductive layer ISU-CL of the input sensing layer ISU.

The sensing insulation layer ISU-IL may cover the conductive layer ISU-CL and be disposed on the conductive layer ISU-CL. The window 100 may be disposed on the sensing insulation layer ISU-IL. In addition, an adhesive layer may be disposed between the sensing insulation layer ISU-IL and the window 100. However, the present inventive concept is not limited thereto.

Figure 7A:
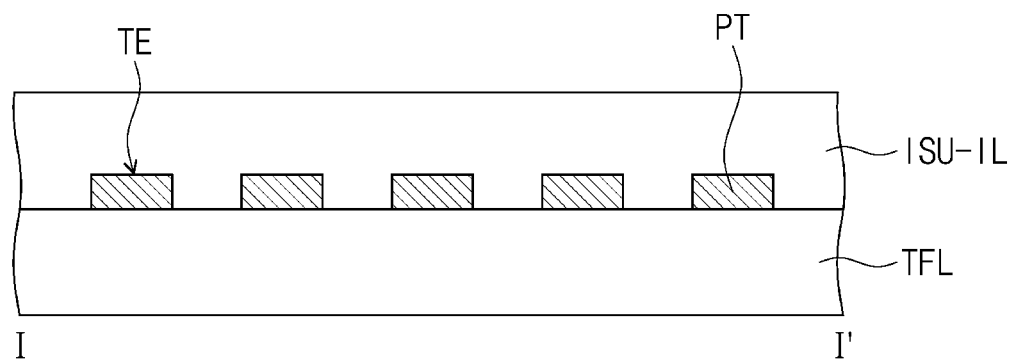
FIG. 7A is a cross-sectional view taken along line I-I' of FIG. 6 according to an exemplary embodiment of the present inventive concept.

Referring to FIGS. 6 and 7A, the conductive layer ISU-CL may include a plurality of sensing patterns TE overlapping the active area AA. As described above, since the active area AA corresponds to the display area DP-DA, the sensing patterns TE may overlap the display area DP-DA.

The sensing patterns TE have unique coordinate information. For example, the sensing patterns TE may be arranged in the form of a matrix and respectively connected to the sensing signal lines SL. The shape and arrangement of the sensing patterns TE are not particularly limited. A portion of the sensing signal lines SL may be disposed on the display area DA, and the other portion may be disposed on the non-display area NDA. According to an exemplary embodiment of the present inventive concept, the input sensing layer ISU may acquire coordinate information in a self-capacitive manner. However, the present inventive concept is not limited thereto, and the input sensing layer ISU may acquire coordinate information in various manners.

The sensing signal pads TS-PD overlap the peripheral area NAA and are disposed on the encapsulation layer TFL. For example, the sensing signal pads TS-PD may be directly disposed on the encapsulation layer TFL. The sensing signal pads TS-PD are connected to the sensing signal lines SL, respectively. As a result, the sensing signal pads TS-PD may respectively receive sensing signals outputted from the sensing patterns TE through the signal lines SL to transmit the received sensing signals to the outside or may respectively transmit the sensing signals transmitted to the outside to the sensing patterns TE through the signal lines SL.

According to an exemplary embodiment of the present inventive concept, each of the sensing patterns TE may have a mesh shape. As illustrated in FIG. 7A, a cross-section of one of the sensing patterns TE is illustrated. The one sensing pattern TE may include a plurality of patterns PT forming a mesh shape.

The display area DP-DA may include a light emitting area and a light blocking area adjacent to the light emitting area. The light emitting area refers to an area on which actual light is emitted from the display element layer DP-OLED (see FIG. 3), and the light blocking area refers to an area that absorbs light. The sensing patterns TE may overlap the light blocking area.

Referring again to FIG. 6, the module area MA is illustrated by dotted lines for convenience of description. The module area MA includes an area in which the panel hole MH is formed. For example, the module area MA may be surrounded by one sensing pattern of the sensing patterns TE in the plan view. In this case, the planar surface area of the one sensing pattern TE may be less than that of the other sensing patterns TE. However, the present inventive concept is not limited thereto, and the module area MA may be disposed between two adjacent sensing patterns among the sensing patterns TE.

According to an exemplary embodiment of the present inventive concept, the input sensing layer ISU may further include a crack sensing circuit HCP and a crack pad unit HPD electrically connected to the crack sensing circuit HCP. The crack sensing circuit HCP may be electrically separated from the sensing patterns TE. For example, the crack sensing circuit HCP receives an independent electrical signal. As an additional example, the crack sensing circuit HCP may be insulated from the sensing patterns TE.

The crack sensing circuit HCP includes a crack sensing pattern HCP-M, an auxiliary pattern HCP-S, and a detection line unit electrically connecting the crack sensing pattern HCP-M to the auxiliary pattern HCP-S. The crack sensing circuit HCP may be disposed on the encapsulation layer TFL through the same process as the sensing patterns TE. As a result, each of the sensing patterns TE and the crack sensing circuit HCP may be directly disposed on the encapsulation layer TFL. However, the present inventive concept is not limited thereto; for example, an intervening layer may be present between the crack sensing circuit HCP and the encapsulation layer TFL.

For example, the crack sensing pattern HCP-M may overlap the module area MA and be disposed on the encapsulation layer TFL. The crack sensing pattern HCP-M may be spaced a predetermined distance from the panel hole MH in the plan view. For example, in this embodiment, the crack sensing pattern HCP-M may have an integrated shape extending along the edge of the panel hole MH. For example, the crack sensing pattern HCP-M may have a curved shape that extends along an edge of the panel hole MH, and may have a first end and a second end. For example, the first end and second end of the crack sensing pattern HCP-M are not directly connected to each other.

The auxiliary pattern HCP-S overlaps the module area MA and may be disposed on the encapsulation layer TFL. The auxiliary pattern HCP-S may have a shape extending along an edge of the crack sensing pattern HCP-M between the crack sensing pattern HCP-M and the sensing patterns TE. The auxiliary pattern HCP-S may have a shape similar to that of the crack sensing pattern HCP-M. For example, auxiliary pattern HCP-S may have a curved shape that extends along the curved shape of the crack sensing pattern HCP-M, and may have a first end and a second end. For example, the auxiliary pattern HCP-S may be directly disposed on the encapsulation layer TFL through the same process as the sensing patterns TE. For example, the above-described sensing patterns TE may have the mesh shape, and the auxiliary pattern HCP-S may also have the mesh shape.

In addition, the sensing patterns TE, each of the crack sensing pattern HCP-M, and the auxiliary pattern HCP-S includes a conductive material having conductivity. The conductive material may include a metal layer or a transparent conductive layer. The metal layer may be formed of, for example, molybdenum, silver, titanium, copper, aluminum, and an alloy thereof. The transparent conductive layer may include, for example, transparent conductive oxide such as indium tin oxide (ITO), indium zinc oxide (IZO), zinc oxide (ZnO), and indium tin zinc oxide (ITZO). In addition, the transparent conductive layer may include PEDOT, a metal nano wire, and graphene.

The detection line unit may electrically connect the crack sensing pattern HCP-M to the auxiliary pattern HCP-S and may be electrically separated from the sensing patterns TE. For example, the detection line unit includes a first detection line part CL1, a second detection line part CL2, and a third detection line part.

The first detection line part CL1 includes a first main line HL1 and a first connection line BL1. The first main line HL1 overlaps the peripheral area NAA and is disposed on the encapsulation layer TFL. The first connection line BL1 connects the first main line HL1 to one end of the crack sensing pattern HCP-M. The first connection line BL1 may overlap each of the peripheral area NAA and the active area AA. For example, the first main line HL1 and the first connection line BL1 may be integrated with each other.

The second detection line part CL2 includes a second main line HL2 and a second connection line BL2. The second main line HL2 is disposed on the encapsulation layer TFL. The second connection line BL2 connects the second main line HL2 to one end of the auxiliary pattern HCP-S. Each of the second main line HL2 and the second connection line BL2 may overlap each of the peripheral area NAA and the active area AA. For example, the second connection line BL2 may be electrically connected to the auxiliary pattern HCP-S having the mesh shape at at least one or more points. For example, the second main line HL2 and the second connection line BL2 may be integrated with each other.

The third detection line part includes a third main line HL3. The third main line HL3 is connected to the other end of the auxiliary pattern HCP-S and may overlap each of the peripheral area NAA and the active area AA. The third main line HL3 may be electrically connected to the auxiliary pattern HCP-S having the mesh shape at at least one or more points.

According to an exemplary embodiment of the present inventive concept, the first to third main lines HL1, HL2, and HL3 may be spaced apart from each other in the plan view. For example, since the conductive layer ISU-CL of the input sensing layer ISU according to an exemplary embodiment of the present inventive concept is provided as the single layer, the first detection line part CL1, the second detection line part CL2, and the third detection may have a structure in which the first to third detection line parts CL1 and CL2 are spaced apart from each other.

In addition, the first detection line part CL1, the second detection line part CL2, and the third detection line part may be disposed on the encapsulation layer TFL through the same process as the above-described sensing patterns TE and crack sensing circuit HCP. For example, the first detection line part CL1, the second detection line part CL2, and the third detection line part may be directly disposed on the encapsulation layer TFL.

The crack pad part HPD includes a first pad part HPD1 and a second pad part HPD2. Each of the first pad part HPD1 and the second pad part HPD2 may overlap the peripheral area NAA and be disposed on the encapsulation layer TFL.

The first pad part HPD1 includes a first output pad HO1 and first input pad HIN1. The first output pad HO1 is connected to one end of the first main line HL1. The first input pad HIN1 is connected to one end of the second main line HL2. The other end of the second main line HL2 is connected to the other end of the crack sensing pattern HCP-M.

The second pad part HPD2 includes a second output pad HO2 and a second input pad HIN2. The second output pad HO2 is connected to the other end of the first main line HL1. The second input pad HIN2 is connected to one end of the third main line HL3. The other end of the third main line HL3 is connected to the other end of the auxiliary pattern HCP-S.

The first input pad HIN1 and the second input pad HIN2 receive a detection signal transmitted from the main board MB illustrated in FIG. 1B. For example, the first input pad HIN1 receives a first detection signal transmitted from the main board MB, and the second input pad HIN2 receives a second detection signal transmitted from the main board MB. Each of the first detection signal and the second detection signal may be transmitted again to the main board MB through the first output pad HO1 and the second output pad HO2. Hereinafter, the first detection signal and the second detection signal, which are outputted through the first output pad HO1 and the second output pad HO2, will be described as output detection signals.

For example, the first detection signal and the second detection signal may be provided at the same time through the first input pad HIN1 and the second input pad HIN2. In this case, whether the crack sensing pattern HCP-M is damaged may be detected depending on whether the output detection signal is transmitted again to the main board MB through the first output pad HO1 and the second output pad HO2.

For example, when the output detection signal is not transmitted to the main board MB through the first output pad HO1 and the second output pad HO2, the crack sensing pattern HCP-M is considered to be damaged. In addition, when the output detection signal is transmitted to the main board MB through only one of the first output pad HO1 or the second output pad HO2, a portion of the above-described detection line units may be considered to be damaged.

Whether cracks occur in the module area MA may be determined through the above-described signal. According to exemplary embodiment of the present inventive concept, since the crack sensing circuit HCP is further provided, defects occurring in the input sensing layer ISU, for example, the module area MA, may be easily detected. Thus, the electronic apparatus may be improved in reliability, and whether the electronic apparatus is defective may be determined without a separate test circuit or a test device to increase process efficiency.

Referring to FIG. 7B, the circuit element layer DP-CL is disposed on the base substrate BS. The circuit element layer DP-CL includes a thin film transistor TR (hereinafter, referred to as a thin film transistor) corresponding to a second thin film transistor TR2 (see FIG. 4A) among the insulation layers 10, 20, 31, 32, and 40 and the constituents illustrated in the equivalent circuit diagram of FIG. 4A. Each of the insulation layers 10, 20, 31, 32, and 40 may include an organic material and/or an inorganic material and have a single-layered or multilayered structure. The display element layer DP-OLED includes a pixel defining layer 50 and a light emitting element EE. In this specification, the light emitting element EE may be described as a display element.

The first insulation layer 10 is disposed on the base substrate BS to cover an entire surface of the base substrate BS. The first insulation layer 10 may include a barrier layer 11 and/or a buffer layer 12. Thus, the first insulation layer 10 may prevent oxygen or moisture introduced through the base substrate BS from being permeated into the pixel or from reducing the rigidity of the base substrate BS to stably form the pixel on the base substrate BS.

This is merely an example. For example, in the electronic module 400 according to an exemplary embodiment of the present inventive concept, at least one of the barrier layer 11 and the buffer layer 12 may be omitted, and a plurality of layers may be laminated, but the present inventive concept is not limited thereto.

The thin film transistor TR is disposed on the first insulation layer 10. The thin film transistor TR includes a semiconductor pattern SP, a control electrode CE, an input electrode IE, and an output electrode OE. The semiconductor pattern SP is disposed on the first insulation layer 10. The semiconductor pattern SP may include a semiconductor material. The control electrode CE is spaced apart from the semiconductor pattern SP with a second insulation layer 20 therebetween. The control electrode CE may be connected to one electrode of the first thin film transistor TR1 (see FIG. 4A) and the capacitor CP (see FIG. 4A).

The input electrode IE and the output electrode OE are disposed on the third insulation layers 31 and 32 and spaced apart from each other in the plan view. The input electrode IE and the output electrode OE are connected to one side and the other side of the semiconductor pattern SP by passing through the first insulation layer 10 and the third insulation layers 31 and 32, respectively.

The display panel DP according to an exemplary embodiment of the present inventive concept may further include an upper electrode UE. In this embodiment, the third insulation layers 31 and 32 are illustrated as including a lower layer 31 and an upper layer 32. However, this is merely an example. For example, the third insulation layers 31 and 32 according to an exemplary embodiment of the present inventive concept may have a single-layered structure, but the present inventive concept is not limited thereto.

The upper electrode UE is disposed between the lower layer 31 and the upper layer 32. The upper electrode UE may overlap the control electrode CE in the plan view. In this embodiment, the upper electrode UE may receive the same electrical signal as the control electrode CE or may receive an electrical signal different from that of the control electrode CE to function as one electrode of the capacitor. This is merely an example. In the electronic panel 200 according to an exemplary embodiment of the present inventive concept, the upper electrode UE may be omitted, but is not limited to a specific embodiment.

The fourth insulation layer 40 may be disposed on the upper layer 32 to cover the input electrode IE and the output electrode OE. In the thin film transistor TR, the semiconductor pattern SP may be disposed on the control electrode CE. In addition, the semiconductor pattern SP may be disposed on the input electrode IE and the output electrode OE. In addition, the input electrode IE and the output electrode OE may be disposed on the same layer and be directly connected to the semiconductor pattern SP. The thin film transistor TR according to an exemplary embodiment of the present inventive concept may have various structures, but the present inventive concept is not limited thereto.

The light emitting element EE is disposed on the fourth insulation layer 40. The light emitting element EE includes a first electrode E1, an organic layer EL, and a second electrode E2.

The first electrode E1 may be connected to the thin film transistor TR by passing through the fourth insulation layer 40. The electronic panel 200 may further include a separate connection electrode disposed between the first electrode E1 and the thin film transistor TR. Here, the first electrode E1 may be electrically connected to the thin film transistor TR through the connection electrode.

The pixel defining layer 50 is disposed on the fourth insulation layer 40. The pixel defining layer 50 may include an organic material and/or an inorganic material and have a single-layered or multilayered structure. An opening may be provided in the pixel defining layer 50. The opening may expose at least a portion of the first electrode E1.

The organic layer EL is disposed between the first electrode E1 and the second electrode E2. The organic layer EL may include at least one light emitting layer. For example, the organic layer EL may be made of at least one material of materials that emit light having red, green, or blue colors and may include fluorescent material or a phosphorescent material. The organic layer EL may include an organic light emitting material or an inorganic light emitting material. The organic layer EL may emit light in response to a difference in potential between the first electrode E1 and the second electrode E2.

In this embodiment, the organic layer EL is illustrated as a layer having an integrated shape overlapping the plurality of openings of the pixel defining layer 50. However, this is merely an example. For example, the organic layer EL may be provided as a plurality of patterns corresponding to each opening, but the present inventive concept is not limited thereto.

For example, the organic layer EL may further include a charge control layer in addition to the light emitting layer. The charge control layer may control movement of the charges to increase luminous efficiency and lifespan of the light emitting element. Here, the organic layer EL may include at least one of hole transport material, a hole injection material, an electron transport material, or an electron injection material.

The second electrode E2 is disposed on the organic layer EL. The second electrode E2 may face the first electrode E1. The second electrode E2 may have an integrated shape that extends from the active area AA to the peripheral area NAA. For example, the second electrode E2 may be commonly provided to the plurality of pixels. The light emitting element EE disposed on each of the pixels may receive a common power voltage (hereinafter, referred to as a second power voltage) through the second electrode E2.

The second electrode E2 may include a transmissive conductive material or a transflective conductive material. Thus, the light generated in the light emitting pattern EP may be easily emitted in the third direction DR3 through the second electrode E2. However, this is merely an example. For example, the light emitting element EE according to an exemplary embodiment of the present inventive concept may be driven in a bottom emission manner including a transmissive or semi-transmissive material, or the light emitting element EE may be driven in a double-side emission manner in which light is emitted from all of the front and rear surfaces, but the present inventive concept is not limited thereto.

The encapsulation layer TFL may be disposed on the light emitting element EE to encapsulate the light emitting element EE. A capping layer covering the second electrode E2 may be further disposed between the second electrode E2 and the encapsulation layer TFL.

The encapsulation layer TFL may include a first inorganic layer 61, an organic layer 62, and a second inorganic layer 63, which are sequentially laminated in the third direction DR3. However, the present inventive concept is not limited thereto. For example, the encapsulation layer TFL may further include a plurality of inorganic layers and a plurality of organic layers.

The first inorganic layer 61 may cover the second electrode E2. The first inorganic layer 61 may prevent external moisture or oxygen from being permeated into the light emitting element EE. For example, the first inorganic layer 61 may include silicon nitride, silicon oxide, or a combination thereof. The first inorganic layer 61 may be formed through a chemical vapor deposition process.

The organic layer 62 may be disposed on the first inorganic layer 61 to contact the first inorganic layer 61. The organic layer 62 may provide a flat surface on the first inorganic layer 61. A curve disposed on a top surface of the first inorganic layer 61 or particles existing on the first inorganic layer 61 may be covered by the organic layer 62 to prevent the surface state of a top surface of the first inorganic layer 61 from having an influence on the constituents disposed on the organic layer 62. In addition, the organic layer 62 may reduce stress between the layers contacting each other. For example, the organic layer 62 may include an organic material and be formed through a solution process such as spin coating, slit coating, inkjet process, and the like.

The second inorganic layer 63 may be disposed on the organic layer 62 to cover the organic layer 62. The second inorganic layer 63 may be stably formed on the flat surface when compared to the organic layer 62 disposed on the first inorganic layer 61. The second inorganic layer 63 may encapsulate moisture discharged from the organic layer 62 to prevent the moisture from being introduced. The second inorganic layer 63 may include, for example, silicon nitride, silicon oxide, or a combination thereof. The second inorganic layer 63 may be formed through a chemical vapor deposition process.

According to this embodiment, the module area MA may include a panel hole MH and a line area LA. The line area LA may be an area between the panel hole MH and the active area AA. The line area LA may surround the panel hole MH in the plan view. In the line area LA, the light emitting element EE and/or the thin film transistor TR disposed on the active area AA may be omitted. Thus, transmittance may be relatively higher than that of the active area AA.

Groove parts GV1, GV2 and GV3, a dam part DMP, and signal lines SL1 and SL2 of the display panel DP may be disposed on the line area LA.

The groove parts GV1, GV2, and GV3 may be formed to be spaced apart from each other. The groove parts GV1, GV2, and GV3 are illustrated as first to third groove parts GV1, GV2, and GV3, which are spaced apart from the active area AA and sequentially disposed in a direction that approaches the panel hole MH. Each of the first to third groove parts GV1, GV2, and GV3 has a close-line (e.g., a close loop) shape surrounding the panel hole MH, or an intermittent line shape surrounding at least a portion of the edge of the panel hole MH, but the present inventive concept is not limited thereto. For example, each of the first to third groove parts GV1, GV2 and GV3 may have a circular shape.

Each of the groove parts GV1, GV2, and GV3 is formed by recesses being formed from a top surface of the base substrate BS. In other words, the groove parts GV1, GV2, and GV3 are recesses in the top surface of the base substrate BS. Each of the groove parts GV1, GV2, and GV3 may be provided by removing at least a portion of the base substrate BS. A deposition pattern ELP may be disposed in each of the groove parts GV1, GV2, and GV3 and may be covered by at least one of the first inorganic layer 61 or the second inorganic layer 63.

Since the electronic panel 200 according to an exemplary embodiment of the present inventive concept further includes the groove parts GV1, GV2, and GV3, continuity between the deposition pattern ELP and the light emitting element EE may be prevented. Thus, a permeation path of the external moisture or the oxygen may be blocked to prevent the elements disposed on the active area AA from being damaged.

In addition, the deposition pattern ELP disposed in each of the groove parts GV1, GV2, and GV3 may be covered by the first inorganic layer 61 to prevent the deposition pattern ELP from having an influence on other elements when the electronic panel 200 is manufactured. Thus, process reliability of the display module 200 may be increased. However, this is merely an example. For example, in the electronic panel 200 according to an exemplary embodiment of the present inventive concept, the groove parts GV1, GV2, and GV3 may be provided singly or omitted, and the present inventive concept is not limited thereto.

The dam part DMP is disposed on the line area LA to partition the formation area of the organic layer 62 into predetermined areas and prevent the organic layer 62 from being additionally expanded. The dam part DMP may be provided in plurality and disposed between the groove parts GV1, GV2, and GV3. The dam part DMP is illustrated in a laminated structure including first to third layers P11, P12, and P13. However, this is merely an example. For example, the dam part DMP may have a single layer structure, and is not limited thereto.

The encapsulation layer TFL according to an exemplary embodiment of the present inventive concept may further include a planarization layer OC. The planarization layer OC includes an organic material. The planarization layer OC is disposed on the line area LA, the active area AA, and the peripheral area NAA of the module area MA. The planarization layer OC covers a non-planar surface provided on the module area MA by the dam part DMP or the groove parts GV1, GV2 and GV3 to provide a flat surface on the top surface thereof. Thus, the flat surface may be stably provided on an area on which the organic layer 62 is not disposed in the module area MA.

The crack sensing pattern HCP-M and the auxiliary pattern HCP-S according to an exemplary embodiment of the present inventive concept may be disposed on the encapsulation layer TFL to overlap the line area LA.

Figure 9:
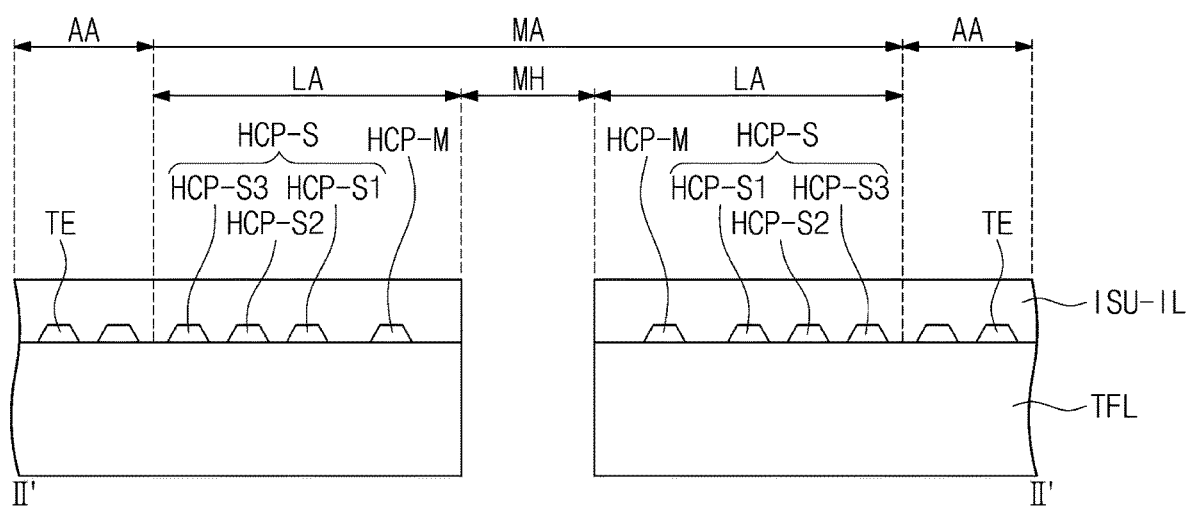
FIG. 9 is a cross-sectional view taken along line II-II' of FIG. 8.

FIG. 8 is a plan view of the crack sensing circuit according to an exemplary embodiment of the present inventive concept. FIG. 9 is a cross-sectional view taken along line II-II' of FIG. 8.

Referring to FIG. 8 and FIG. 6, the first detection signal IP1 inputted to the first input pad HIN1 is transmitted to the second end ND1b of the crack sensing pattern HCP-M through the second main line HL2, and from the second end ND1b, the first detection signal IP1 is transmitted to the first end ND1a of the crack sensing pattern HCP-M. The first detection signal IP1 may be transmitted from the first end ND1a of the crack sensing pattern HCP-M to the first output pad HO1 and the second output pad HO2 through the first connection line BL1 and the first main line HL1.

The second detection signal IP2 inputted to the second input pad HIN2 is transferred to the second end ND2b of the auxiliary pattern HCP-S through the third main line HL3, and from the second end ND2b, the second detection signal IP2 is transmitted to the first end ND2a of the auxiliary pattern HCP-S. The second detection signal IP2 is transmitted from the first end ND2a of the auxiliary pattern HCP-S to the second end ND1b of the crack sensing pattern HCP-M through the second connection line BL2 and the second main line HL2. The second detection signal IP2 may be transmitted from the second end ND1b of the crack sensing pattern HCP-M to the first output pad HO1 and the second output pad HO2 through the first connection line BL1 and the first main line HL1.

For example, when the first detection signal IP1 and the second detection signal IP2, e.g., the output detection signals are detected at each of the first output pad HO1 and the second output pad HO2, the crack sensing pattern HCP may be considered as being not damaged.

For example, when the output detection signal is not detected at each of the first output pad HO1 and the second output pad HO2, the crack sensing pattern HCP-M is considered to be damaged. In addition when the output detection signal is detected at only one of the first output pad HO1 and the second output pad HO2, then one of the first detection line pan CL1, the second detection line part CL2, and the third detection line part is considered to be damaged.

In addition, according to an exemplary embodiment of the present inventive concept, the first shortest distance between the crack sensing pattern HCP-M and a center HC of the module area MA may be less than the second shortest distance between the auxiliary pattern HCP-S and a center HC of the module area MA. For example, the auxiliary patterns HCP-S may have a shape in which the auxiliary patterns HCP-S are spaced a predetermined distance from the crack sensing pattern HCP-M to surround the crack sensing pattern HCP-M.

Referring to FIG. 9, each of the crack sensing pattern HCP-M, the auxiliary pattern HCP-S, and the sensing patterns TE may be disposed on the encapsulation layer TFL. For example, each of the crack sensing pattern HCP-M, the auxiliary pattern HCP-S, and the sensing patterns TE may be directly disposed on the encapsulation layer TFL. In addition, the crack sensing pattern HCP-M, the auxiliary pattern HCP-S, and the sensing patterns TE may be spaced apart from each other in the plan view.

For example, the auxiliary pattern HCP-S and the crack sensing pattern HCP-M are electrically connected to each other, but each of the auxiliary pattern HCP-S and the crack sensing pattern HCP-M may not be electrically connected to the sensing patterns TE.

In addition, the auxiliary pattern HCP-S may have a mesh shape and include a plurality of patterns HCP-S1, HCP-S2, and HCP-S3 spaced apart from each other in the plan view. However, the shape of the auxiliary pattern HCP-S is not limited thereto and may be variously modified.

Figure 10A:
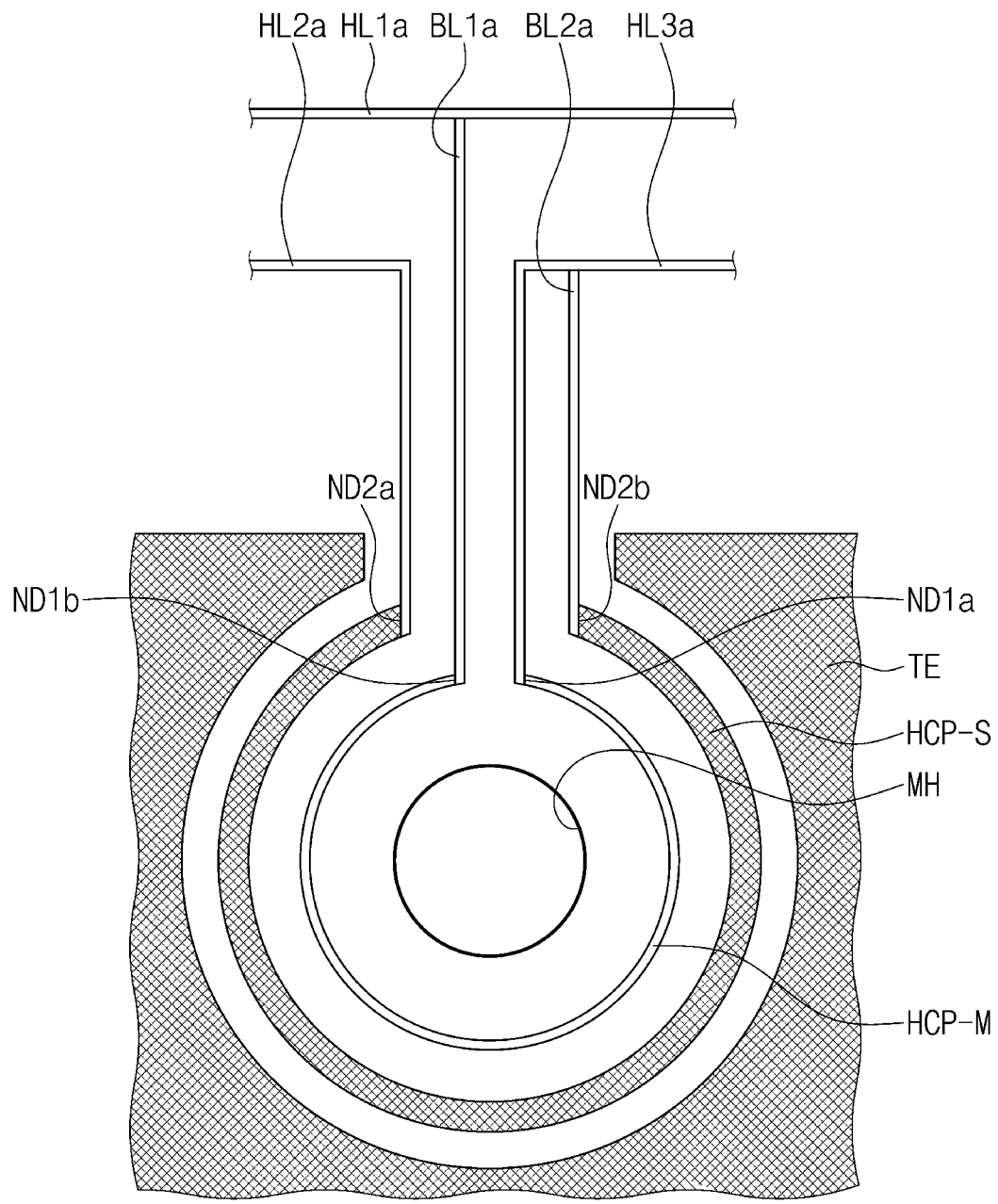
FIGS. 10A, 10B and 10C are plan views of a crack sensing circuit according to an exemplary embodiment of the present inventive concept.
Figure 10B:
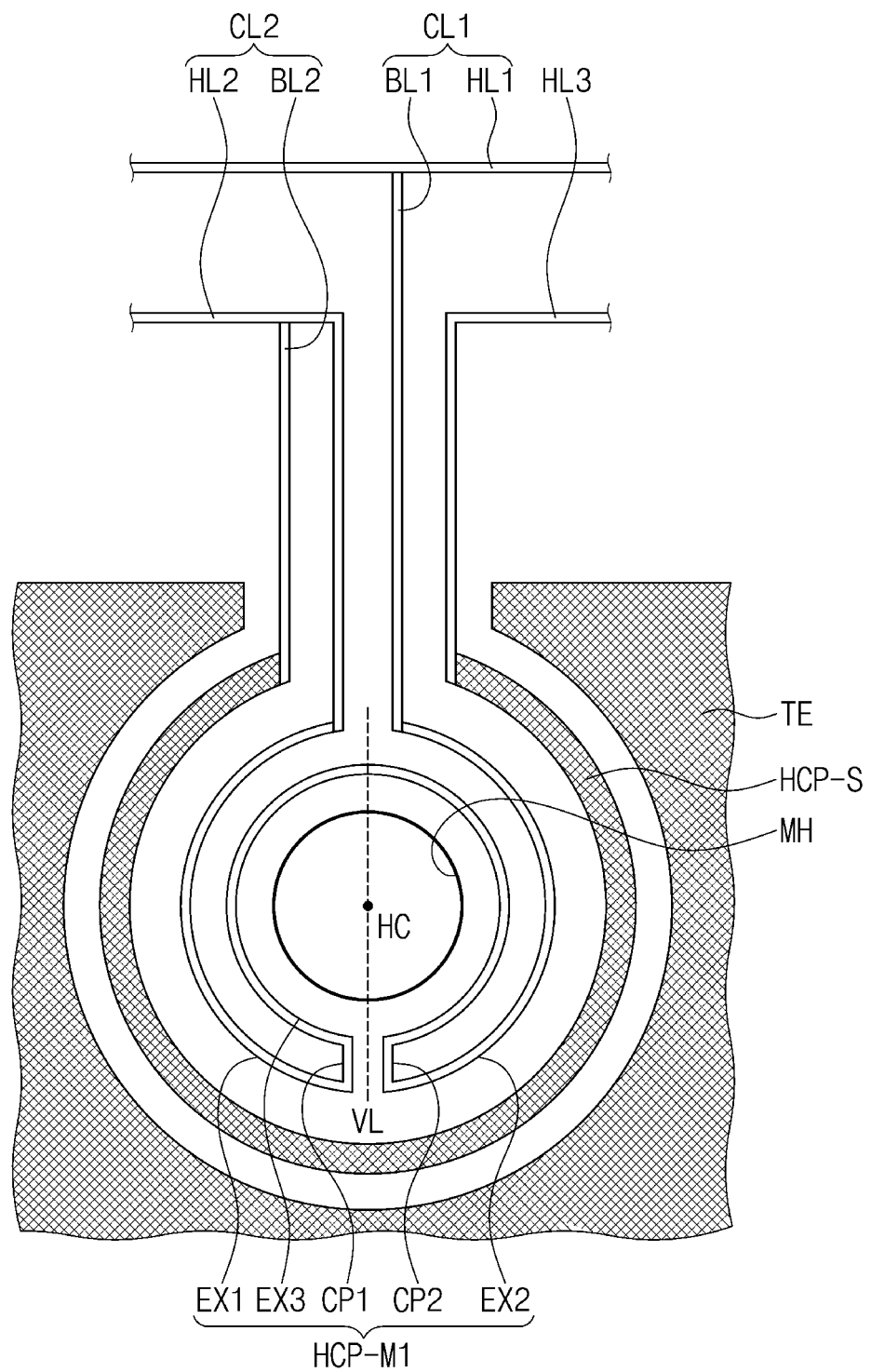
Figure 10C:
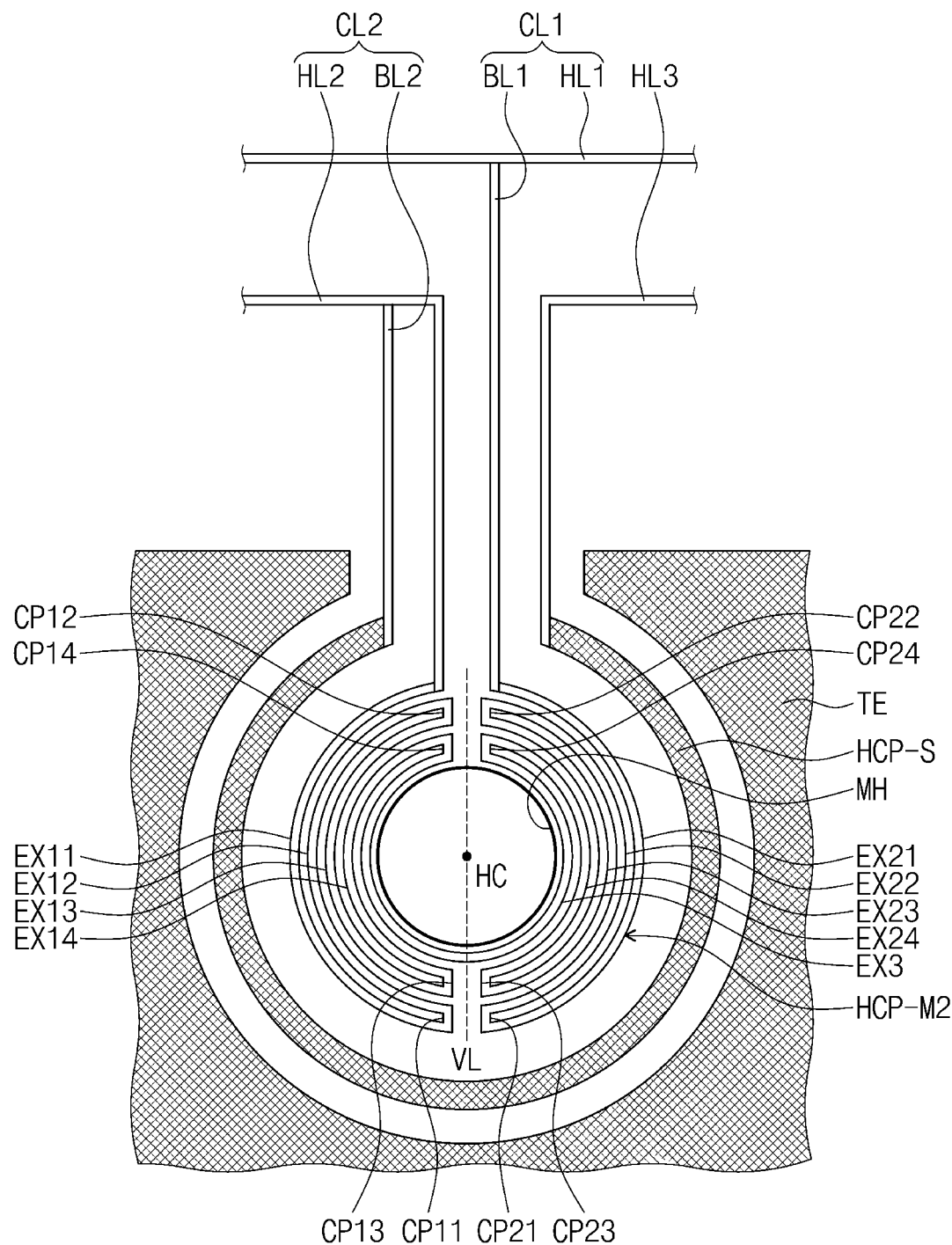

FIG. 10A to 10C are plan views of a crack sensing circuit according to an exemplary embodiment of the present inventive concept.

In the crack sensing circuit illustrated in FIG. 10A, a connection structure between a detection line unit, a crack sensing pattern HCP-M, and an auxiliary pattern HCP-S is modified when compared to the crack sensing circuit illustrated in FIG. 8.

For example, one end (e.g., a first end) ND1a of the crack sensing pattern HCP-M is connected to a third main line HL3a, and the other end (e.g., a second end) ND1b of the crack sensing pattern HCP-M is connected to one end of a first connection line BL1a. The other end of a first connection line BL1a is connected to a first mainline HL1a. One end (e.g., the first end) ND2a of the auxiliary pattern HCP-S is connected to the second main line HL2a, and the other end (e.g., a second end) ND2b of the auxiliary pattern HCP-S is connected to one end of the second connection line BL2a. The other end of a second connection line BL2a is connected to the third main line HL3a.

The crack sensing circuit HCP illustrated in FIG. 10A also receives a detection signal through a first input pad HIN1 and a second input pad HIN2. In addition, the detection signal may be transmitted again to a main board MB through the first output pad HO1 and the second output pad HO2.

Referring to FIG. 10B, a crack sensing circuit illustrated in FIG. 10B has only been modified in shape of the crack sensing pattern HCP-M1 when compared to the crack sensing circuit illustrated in FIG. 8, and the structure of the remaining constituents and components may be substantially the same.

The crack sensing pattern HCP-M1 may include a first extension part EX1, a second extension part EX2, a third extension part EX3, a first connection part CP1, and a second connection part CP2. The first extension part EX1, the second extension part EX2, the third extension part EX3, the first connection part CP1, and the second connection part CP2 may be connected to each other to provide an integrated shape.

The first extension part EX1 and the second extension part EX2 face each other with respect to a symmetrical axis VL. The first extension part EX1 and the second extension part EX2 are respectively disposed within a module area MA to extend along an edge of a panel hole MH. The first extension part EX1 and the second extension part EX2 may be substantially disposed on a line area LA.

The first extension part EX1 is disposed at a left side of the symmetrical axis VL, and the second extension part EX2 is disposed at a right side of the symmetrical axis VL. The first extension part EX1 may have a semicircular shape that is convex toward the left side, and the second extension part EX2 may have a semicircular shape that is convex toward the right side. The first extension part EX1 and the second extension part EX2 may be linearly symmetrical with respect to the symmetrical axis VL.

The third extension part EX3 may be spaced apart from the first extension part EX1 and the second extension part EX2. The third extension part EX3 may be disposed closer to a center HC of the area than the first extension part EX1 and the second extension part EX2.

The third extension part EX3 is disposed within the module area MA to extend along the edge of the module area MA. For example, the third extension part EX3 may extend along the edge of the panel hole MH. The third extension part EX3 may overlap the symmetrical axis VL in a plan view. The third extension part EX3 may cross the symmetrical axis VL.

The first connection part CP1 connects one end of the first extension part EX1 to one end of the third extension part EX3. The second connection part CP2 is spaced apart from the first connection part CP1 to connect one end of the second extension part EX2 to the other end of the third extension part EX3.

The first connection part CP1 and the second connection part CP2 may face each other with the symmetrical axis VL therebetween. Each of the first connection part CP1 and the second connection part CP2 may extend along a direction parallel to the extending direction of the symmetrical axis VL. In this embodiment, each of the first connection part CP1 and the second connection part CP2 may be parallel to the symmetrical axis VL. The first connection part CP1 and the second connection part CP2 may be linearly symmetrical to each other with respect to the symmetrical axis VL.

Referring to FIG. 10C, a crack sensing circuit illustrated in FIG. 10C has only been modified in shape of the crack sensing pattern HCP-M2 when compared to the crack sensing circuit illustrated in FIG. 8, and the structure of the remaining constituents and components may be substantially the same.

The crack sensing pattern HCP-M2 may include four first extension parts EX11, EX12, EX13, and EX14, four second extension parts EX21, EX22, EX23, and EX24, and four first connection parts CP11, CP12, CP13, and CP14, and four second connection parts CP21, CP22, CP23, and CP24.

The first-first extension part EX11 and the first-second extension part EX21, which are disposed at the outermost side from the center HC of the module area MA among the first extension parts EX11, EX12, EX13, and EX14 and the second extension parts EX21, EX22, EX23, and EX24 are connected to the second main line HL2 and the first connection line BL1, respectively.

The fourth-first extension part EX14 and the fourth-second extension part EX24, which are disposed closest to the center HC of the module area MA among the first extension parts EX11, EX12, EX13, and EX14 and the second extension parts EX21, EX22, EX23, and EX24, are connected to the third extension part EX3.

The first connection parts CP11, CP12, CP13, and CP14 connect the first extension parts EX11, EX12, EX13, and EX14 to the third extension part EX3, respectively. The second connection parts CP21, CP22, CP23, and CP24 connect the second extension parts EX21, EX22, EX23, and EX24 to the third extension part EX3, respectively.

The first extensions EX11, EX12, EX13, and EX14 and the second extensions EX21, EX22, EX23, and EX24 may be linearly symmetrical to each other with respect to the symmetrical axis VL. In addition, the first connection parts CP11, CP12, CP13, and CP14 and the second connection parts CP21, CP22, CP23, and CP24 may be linearly symmetrical to each other with respect to the symmetrical axis VL. Thus, the crack sensing pattern HCP-M2 may have a linearly symmetrical shape with respect to the symmetrical axis VL.

According to an exemplary embodiment of the present inventive concept, the electronic panel may include the panel hole overlapping the active area and the crack sensing pattern disposed adjacent to the panel hole. The crack sensing pattern may sense the external foreign substances permeated into the circuit element through the panel hole.

For example, the input sensing layer according to exemplary embodiment of the present inventive concept may include the single conductive layer. As a result, the crack sensing pattern and the sensing pattern may be disposed on the single conductive layer of the input sensing layer through the same process. Therefore, the overall process rate of the electronic apparatus may be increased.

While the present inventive concept has been described with reference to exemplary embodiments thereof, it will be understood by those of ordinary skill in the art that various changes in form and details may be made thereto without departing from the spirit and scope of the present inventive concept.

What is claimed is:

1. An electronic panel comprising:
a base substrate comprising a first area and a second area adjacent to the first area, wherein the first area comprises a module area and a display area adjacent to the module area;
a display element layer comprising a plurality of display elements, wherein the plurality of display elements overlaps the display area and are disposed on the base substrate;
an encapsulation layer configured to cover the display elements and disposed on the base substrate;
sensing patterns overlapping the display area and disposed on the encapsulation layer;

a crack sensing pattern overlapping the module area and disposed on the encapsulation layer;

an auxiliary pattern overlapping the module area and disposed on the encapsulation layer, wherein the auxiliary pattern has a shape that extends along an edge of the crack sensing pattern and extends between the sensing patterns and the crack sensing pattern; and a signal line disposed on the encapsulation layer to electrically connect the crack sensing pattern to the auxiliary pattern.

2. The electronic panel of claim 1, wherein the signal line comprises:

a first detection line part comprising a first main line and a first connection line configured to connect the first main line to a first end of the crack sensing pattern, wherein the first main line overlaps the second area;

a second detection line part comprising a second main line and a second connection line configured to connect the second main line to a first end of the auxiliary pattern, wherein the second main line is connected to a second end of the crack sensing pattern; and a third direction line part comprising a third main line connected to a second end of the auxiliary pattern.

3. The electronic panel of claim 2, wherein the first main line, the second main line, and the third main line are spaced apart from each other in a plan view.

4. The electronic panel of claim 3, wherein the crack sensing pattern has a curved shape.

5. The electronic panel of claim 2, further comprising:

a first pad part comprising a first output pad and a first input pad connected to a first end of the second main line, wherein the first output pad is connected to a first end of the first main line; and a second pad part comprising a second output pad and a second input pad connected to one end of the third main line, wherein the second output pad is connected to a second end of the first main line.

6. The electronic panel of claim 5, wherein a first detection signal inputted to the first input pad is transmitted to the second end of the crack sensing pattern through the second main line, and the first detection signal is transmitted from the second end of the crack sensing pattern to the first end of the crack sensing pattern, and wherein the first detection signal is transmitted from the first end of the crack sensing pattern to the first output pad and the second output pad through the first connection line and the first main line.

7. The electronic panel of claim 6, wherein a second detection signal inputted to the second input pad is transmitted to the second end of the auxiliary pattern through the third main line, and the second detection signal is transmitted from the second end of the auxiliary pattern to the first end of the auxiliary pattern, wherein the second detection signal is transmitted from the first end of the auxiliary pattern to the second end of the crack sensing pattern through the second connection line and the second main line, and wherein the second detection signal is transmitted from the second end of the crack sensing pattern to the first output pad and the second output pad through the first connection line and the first main line.

8. The electronic panel of claim 5, wherein the second end of the second main line is connected to the second end of the crack sensing pattern, and the second end of the third main line is connected to the second end of the auxiliary pattern.

9. The electronic panel of claim 2, wherein the display area surrounds the module area, and each of the sensing patterns and the auxiliary pattern is provided as a mesh pattern.

10. The electronic panel of claim 2, wherein each of the second main line and the third main line comprises a first portion overlapping the second area and a second portion overlapping the display area.

11. The electronic panel of claim 2, wherein the signal line further comprises a plurality of sensing signal lines spaced apart from the first to third detection line parts and respectively connected to the sensing patterns.

12. The electronic panel of claim 1, wherein each of the sensing patterns, the crack sensing pattern, the auxiliary pattern, and the signal line is directly disposed on the encapsulation layer.

13. The electronic panel of claim 1, further comprising a hole provided in the module area to pass through the electronic panel, wherein the crack sensing pattern extends along an edge of the hole.

14. The electronic panel of claim 13, wherein a first distance between the crack sensing pattern and a center of the hole is less than a second distance between the auxiliary pattern and the center of the hole.

15. The electronic panel of claim 13, wherein the crack sensing pattern comprises:

a first extension part extending along an edge of the hole;

a second extension part disposed farther from a center of the hole when compared to the first extension part and is spaced apart from the first extension part to extend along an edge of the first extension part; and a connection part configured to connect the first extension part to the second extension part.

16. The electronic panel of claim 1, wherein the display area is an area on which an image is displayed, and the module area and the second area are a non-display area on which the image is not displayed.

17. An electronic apparatus comprising:

an electronic panel configured to display an image and sense an external input; and an electronic module disposed to overlap the electronic panel, wherein the electronic panel comprises:

a base substrate comprising a module area, an active area, and a peripheral area that is adjacent to the active area, wherein the module area includes a through-hole, and wherein the active area surrounds the module area;

sensing patterns overlapping the active area and disposed on the base substrate;

a crack sensing pattern overlapping the module area and disposed on the base substrate, wherein the crack sensing patterning has a curved shape extending along an edge of the through-hole;

an auxiliary pattern overlapping the module area and disposed on the base substrate, wherein the auxiliary pattern extends along an edge of the crack sensing pattern and extends between the sensing patterns and the crack sensing pattern; and a signal line configured to electrically connect the crack sensing pattern to the auxiliary pattern.

18. The electronic apparatus of claim 17, wherein the sensing patterns, the crack sensing pattern, the auxiliary pattern, and the signal line are disposed on a same layer as each other.

19. The electronic apparatus of claim 17, wherein the sensing patterns, the crack sensing pattern, the auxiliary pattern, and the signal line are disposed on the base substrate through a one-time process using a same material.

20. The electronic apparatus of claim 17, further comprising:
   a first detection line part comprising a first main line and a first connection line configured to connect the first main line to a first end of the crack sensing pattern, wherein the first main line overlaps the peripheral area;
   a second detection line part comprising a second main line and a second connection line configured to connect the second main line to a first end of the auxiliary pattern, wherein the second main line is connected to a second end of the crack sensing pattern; and
   a third detection line part comprising a third main line connected to a second end of the auxiliary pattern.

* * * * *